United States Patent
Baarman et al.

(10) Patent No.: US 10,225,966 B2
(45) Date of Patent: Mar. 5, 2019

(54) COMPOSITE METAL SURFACE

(71) Applicant: Philips IP Ventures B.V., Eindhoven (NL)

(72) Inventors: David W. Baarman, Fennville, MI (US); Benjamin C. Moes, Wyoming, MI (US); Neil W. Kuyvenhoven, Ada, MI (US); Joshua K. Schwannecke, Grand Rapids, MI (US); Roy M. Taylor, Jr., Rockford, MI (US); Kaitlyn J. Turner, Kentwood, MI (US); Robert Wolford, Rockford, MI (US); Matthew J. Norconk, Grand Rapids, MI (US); Ryan D. Schamper, Grand Haven, MI (US)

(73) Assignee: PHILIPS IP VENTURES B.V., Eindhoven (NL)

( * ) Notice: Subject to any disclaimer, the term of this patent is extended or adjusted under 35 U.S.C. 154(b) by 584 days.

(21) Appl. No.: 14/351,905

(22) PCT Filed: Oct. 12, 2012

(86) PCT No.: PCT/US2012/059914
§ 371 (c)(1),
(2) Date: Apr. 15, 2014

(87) PCT Pub. No.: WO2013/056021
PCT Pub. Date: Apr. 18, 2013

(65) Prior Publication Data
US 2014/0295199 A1    Oct. 2, 2014

Related U.S. Application Data

(60) Provisional application No. 61/546,755, filed on Oct. 13, 2011, provisional application No. 61/583,840, filed on Jan. 6, 2012.

(51) Int. Cl.
H05K 9/00 (2006.01)
C08L 63/00 (2006.01)
(Continued)

(52) U.S. Cl.
CPC .......... *H05K 9/0083* (2013.01); *B22F 7/008* (2013.01); *B32B 5/30* (2013.01); *B32B 15/043* (2013.01);
(Continued)

(58) Field of Classification Search
None
See application file for complete search history.

(56) References Cited

U.S. PATENT DOCUMENTS 5,156,771 A * 10/1992 Yamamoto .............. C08K 3/08
  252/512
5,252,255 A    10/1993 Moy et al.
(Continued)

FOREIGN PATENT DOCUMENTS

CN    87 1 08149    6/1988
CN    1336793       2/2002
(Continued)

OTHER PUBLICATIONS

International Search Report and Written Opinion of the International Searching Authority for International Application No. PCT/US2012/059914 dated Mar. 7, 2013.
(Continued)

*Primary Examiner* — Adam Krupicka
(74) *Attorney, Agent, or Firm* — Larry Liberchuk

(57) ABSTRACT

A composite metal surface that looks metallic, but permits effective transmission of an electromagnetic field. The composite metal surface can be integrated into various electronic equipment, such as telephones, remote controls, battery doors, keyboards, mice, game controllers, cameras, laptops,
(Continued)

inductive power supplies, and essentially any other electronic equipment. The composite metal surface can also be integrated into non-electrically conductive heat sinks, high permeability shielding, and polished metal non-electrically conductive surfaces.

22 Claims, 14 Drawing Sheets

(51) Int. Cl.
*H01B 1/22* (2006.01)
*B22F 7/00* (2006.01)
*B32B 5/30* (2006.01)
*B32B 15/04* (2006.01)

(52) U.S. Cl.
CPC ............... *C08L 63/00* (2013.01); *H01B 1/22* (2013.01); *Y10T 428/12014* (2015.01); *Y10T 428/12146* (2015.01)

(56) References Cited

U.S. PATENT DOCUMENTS

| | | | |
|---|---|---|---|
| 5,350,558 A | 9/1994 | Kawato et al. | |
| 5,409,968 A | 4/1995 | Clatanoff et al. | |
| 6,036,815 A | 3/2000 | Peterson et al. | |
| 6,545,212 B1* | 4/2003 | Uchida ............... | H01L 23/552 174/391 |
| 7,396,595 B2 | 7/2008 | Shibuya et al. | |
| 2002/0006988 A1 | 1/2002 | Behi et al. | |
| 2002/0037369 A1 | 3/2002 | Starz et al. | |
| 2005/0090299 A1 | 4/2005 | Tsao et al. | |
| 2008/0237532 A1 | 10/2008 | Moro et al. | |
| 2009/0069485 A1 | 3/2009 | Aoki | |
| 2010/0288418 A1 | 11/2010 | Yang et al. | |
| 2011/0020662 A1 | 1/2011 | Okamoto et al. | |
| 2011/0050382 A1 | 3/2011 | Baarman et al. | |

FOREIGN PATENT DOCUMENTS

| | | |
|---|---|---|
| CN | 101213893 | 7/2008 |
| CN | 101314837 | 12/2008 |
| CN | 101425412 | 5/2009 |
| CN | 10195200 | 12/2010 |
| TW | 200425830 | 11/2004 |
| TW | 200940364 | 10/2009 |
| WO | 2010/1093598 | 8/2010 |

OTHER PUBLICATIONS

Farhana Ahmad Po'Ad et al, "Analytical and Experimental Study of the Shielding Effectiveness of a Metallic Enclosure with Off-Centered Apertures," 17th International Zurich Symposium on Electromagnetic Compatability, 2006, pp. 618-621.

Chalmers M. Butler et al, "Electromagnetic Penetration Through Apertures in Conducting Surfaces," IEEE Transactions on Electromagnetic Compatibility, vol. EMC-20, No. 1., Feb. 1978, pp. 82-93.

Ye.P. Mamunya et al, "Electrical and thermal conductivity of polymers filled with metal powders," European Polymer Journal 38 (2002), pp. 1887-1897.

Aluminum Powder Metallurgy brochure, downloaded from www.aluminum.org and available at least as of Oct. 2011, pp. 1-6.

Metal Cold Casting, information downloaded from http://www.sculpt.com/technotes/COLDCAST.html and available at least as of Oct. 2011, pp. 1-3.

Cold Casting with Metals and Resins, information downloaded from http://aldax.com.au/coldcastingswmetalresins.html and available at least as of Oct. 2011, pp. 1-2.

Tomislav Filetin, "An Overview of the Development and Application of Advanced Materials," Croatian Welding Society, May 2001, pp. 1-46.

Formula for Making Your Own Plastic Molded Objects, information downloaded from http://www.make-stuff.com/formulas_&_remedies/plastics/sulphpl.html and available at least as of Oct. 2011, pp. 1-2.

Home Made Plastic—Apex Community Forums posts dated Sep. 16, 2007 and Sep. 17, 2007 by "Nerdz", downloaded at http://www.forumapex.com/anything_goes/114266-home_made_plastic.html, pp. 1-4.

Bjorklof, Dag, "Shielding for EMC," Compliance Engineering, downloaded at www.ce-mag.com available at least as of Nov. 2010, pp. 1-9.

Clairmont, B.A., et al, "3-D Modeling of Thin Conducive Sheets for Magnetic Field Shielding: Calculations and Measurements," IEEE Transactions on Power Delivery, vol. 14, No. 4, Oct. 1999, pp. 1382-1393.

Celozzi, Salvatore et al, "Electromagnetic Shielding," copyright 2008, certain pages available via Google Books.

* cited by examiner

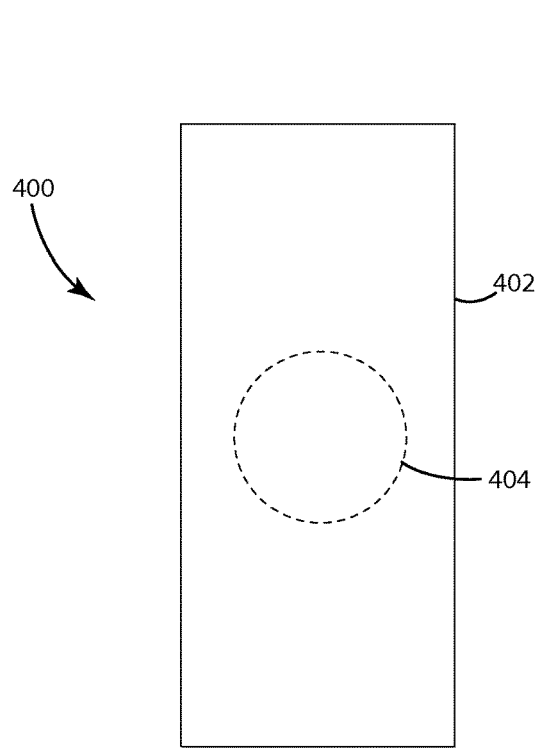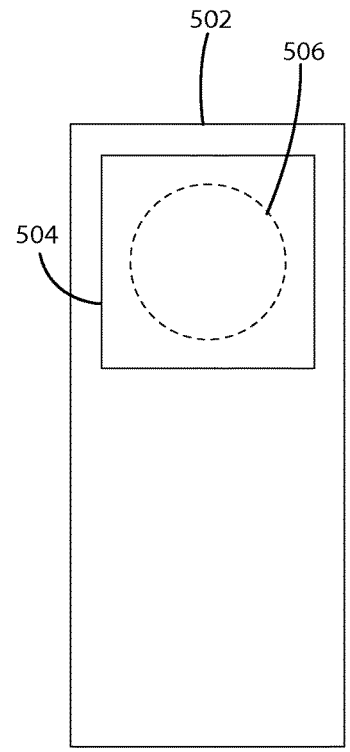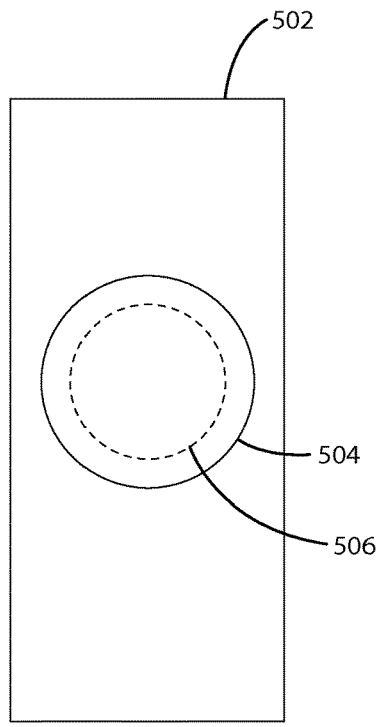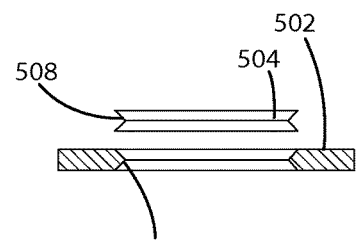
Fig. 4
Fig. 5A
Fig. 5B
Fig. 5C

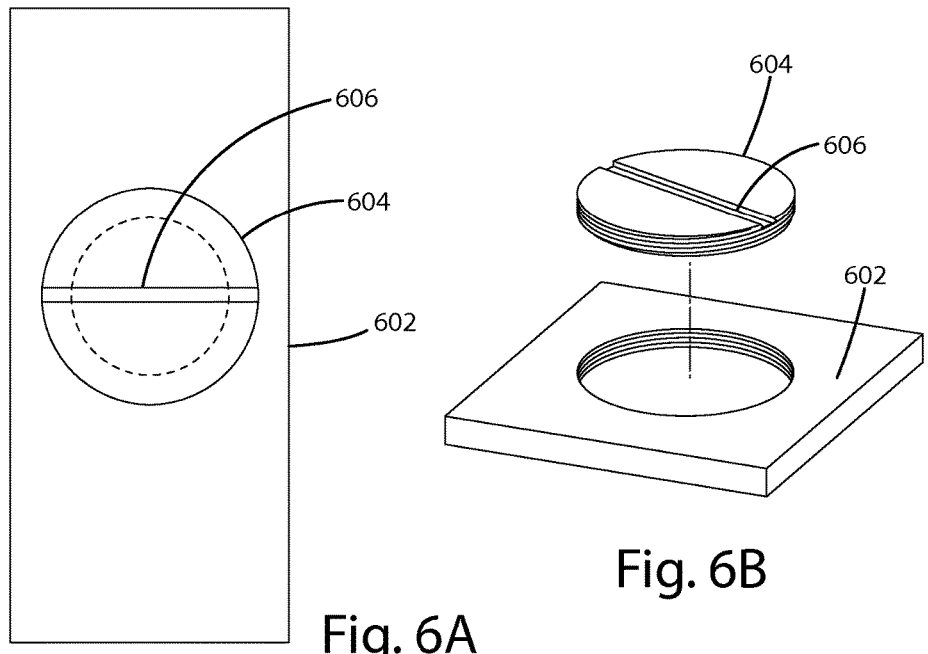
Fig. 6A
Fig. 6B
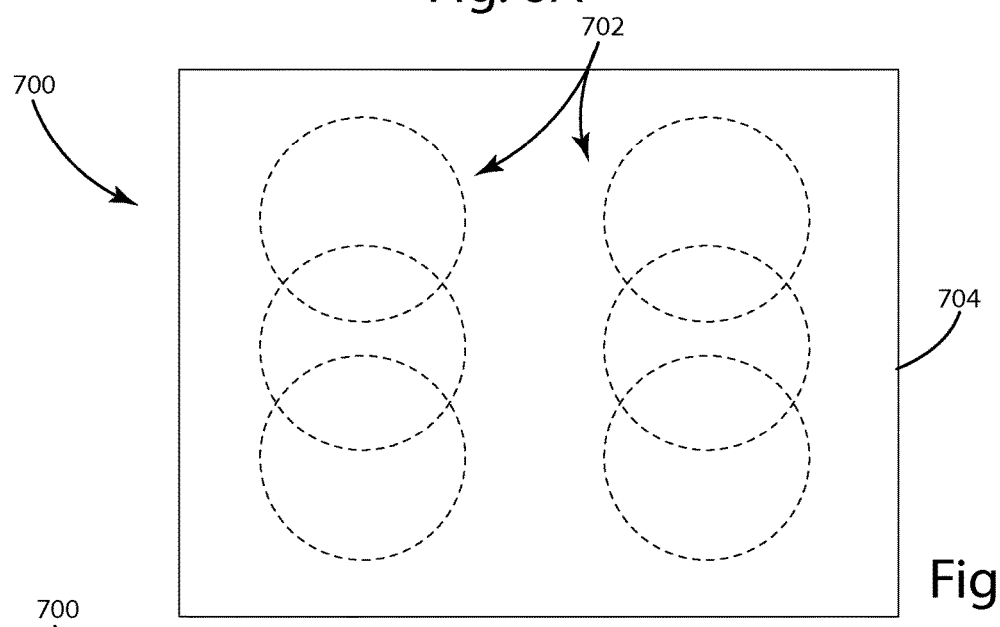
Fig. 7A
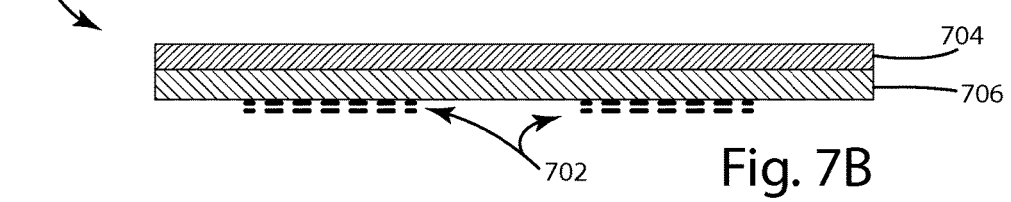
Fig. 7B

COMPOSITE METAL SURFACE

BACKGROUND OF THE INVENTION

Electronic equipment, such as cell phones and laptops, often is shielded to prevent unwanted exposure to electromagnetic radiation and to limit unwanted electromagnetic emission. However, an electromagnetic aperture is routinely provided in the shielding in order to pass electromagnetic fields between electronics located inside electronic equipment and the outside world.

The electronic equipment market, especially the cellular telephone market, is competitive and manufacturers often compete to provide the most aesthetically pleasing device. An enormous amount of resources are spent in designing the look and feel of electronic devices. One common design constraint is the material used to cover the electromagnetic aperture, typically a non-metal material such as rubber or plastic. Unfortunately, the contrast of the non-metal electromagnetic aperture material to the metal shielding material can detract from the aesthetics of the electronic equipment.

Many people find the metal look aesthetically pleasing. Unfortunately, it is difficult to attain a metal look for the entire device because of the non-metal material covering the electromagnetic shield aperture.

SUMMARY OF THE INVENTION

The present invention provides a composite metal surface and methods for manufacturing the same. The composite metal surface looks metallic, but unlike a metal surface permits effective transmission of an electromagnetic field without excessive losses. In one embodiment 5% or less of an electromagnetic field is lost through the composite metal surface. In one embodiment, the composite metal surface has bulk permeability between about 0.95 and 2 and bulk conductivity in the order of $10^{-6}$ Mohs.

The composite metal surface can be integrated into various electronic equipment, such as telephones, remote controls, battery doors, keyboards, mice, game controllers, cameras, laptops, inductive power supplies, and essentially any other electronic equipment. The composite metal surface can also be integrated into non-electrically conductive heat sinks, high permeability shielding, and polished metal non-electrically conductive surfaces.

In one embodiment, the composite metal surface includes about 5% of binder by weight, about 0.2% of lubricant by weight, and a balance of metallic powder such as aluminum powder. In this embodiment, aluminum powder provides a desirable look in the resultant composite metal surface and desirable bulk permeability and bulk conductivity. During manufacture, the binder insulates the aluminum powder particles from each other thereby reducing the bulk conductivity of the resultant composite metal surface. In one embodiment, the bonding process brings both the bulk permeability and the bulk conductivity of the composite metal surface closer to that of air. The individual ingredients and/or the mixture as a whole can be sieved to a particle size range to help with uniformity of the material during the compression process. In addition, the sieving can affect the resultant look of the composite metal surface including how metallic the surface looks.

The type of metal powder, such as aluminum powder, can also influence the final properties of the composite metal surface including the percentage loss of power transfer through the materials at certain frequencies. Further, by blending different materials, the loss can be reduced at some frequencies and increased in others. For example, allowing frequencies where wireless power transfer is occurring to pass but absorbing frequencies where other RF field is present.

There are a variety of ways to manufacture a composite metal surface. In one embodiment, a composite metal surface can be manufactured by compression molding a mixture of metal powder and binder with a press. In alternative embodiments, the composite metal surface can be manufactured using tape casting, metal injection molding, or another molding technique. The types and amounts of powder, binder, and lubricant (if used) can vary depending on the desired bulk conductivity, bulk permeability, and desired metallic look of the surface. They can also vary depending on the particular manufacturing process.

The composite metal surface can be a multi-layer composite metal surface that includes multiple layers each having different properties. Different electromagnetic properties can be achieved by manufacturing each layer with a different amount of binder, metal powder, or vary levels of pressure or heat. In general, the higher the binder content the higher the structural integrity of the composite metal surface and the lower the binder content the more the composite metal surface tends to look metallic. The binder content can affect specific aesthetic qualities of the surface, such as luster. By placing layers with lower binder content near the external viewable surface and layers with higher binder content distal from the external viewable surface, the metallic appearance of the external surface of the composite metal surface can be increased, while the internal structure of the composite metal surface can have higher structural integrity.

A thin conductive layer can be sputter coated, vapor deposited, or screen printed on the composite metal surface in order to provide a genuine metal surface. Thin metal coatings have a tendency to wear away over time and expose the surface below. By providing a composite metal surface below the thin conductive layer, surface wear is less apparent because the surface exposed by the wear looks metallic. The thin conductive layer may not significantly impede the transfer of electromagnetic energy through the composite metal surface. Where there is not sufficient skin depth, eddy currents are less likely to form. Further, the metal layer may cover just a portion of the composite metal surface, for example a logo can be sputter coated on a portion of the composite metal surface.

In one embodiment, a composite metal surface includes an effective amount of metal powder to make the composite metal surface look metallic and an effective amount of binder to reduce the bulk conductivity of the composite metal surface to permit effective transmission of an electromagnetic field through the composite metal surface. The composite metal surface can have a bulk conductivity in the order of $10^{-6}$ Mohs and can have a bulk permeability of between about 0.95 and 2. The composite metal surface can be an electromagnetic aperture in a metal surface of a portable electrical device. The metal powder in the composite metal surface can be ferromagnetic, non-ferromagnetic, or a blend of ferromagnetic and non-ferromagnetic metal powder.

The composite metal surface can be a multi-layer composite metal surface where one layer includes an increased amount of metal powder to make the composite metal surface look metallic and a different layer can include an increased amount of binder to increase the structural integrity of the composite metal surface.

One embodiment of a method for manufacturing a composite metal surface includes the steps of combining an effective amount of metal powder to make the composite metal surface look metallic with an effective amount of binder to reduce the bulk conductivity of the composite metal surface to permit effective transmission of an electromagnetic field through the composite metal surface, mixing the binder and the metal powder, molding the mixture in a pressure press, and curing the molded composite metal surface.

Another embodiment of a method for manufacturing a composite metal surface includes combining an effective amount of metal powder to make the composite metal surface look metallic with an effective amount of binder to reduce the bulk conductivity of the composite metal surface to permit effective transmission of an electromagnetic field through the composite metal surface, feeding the combination of metal powder and binder into an injection molding machine, operating a screw motor of the injection molding machine to move the combination of metal powder and binder through the injection molding machine into a heated chamber, and forcing the combination of metal powder and binder through a nozzle into a mold cavity.

The methods of manufacture of a composite can include dynamically controlling the ratio of metal powder to binder using a sensor. The methods of manufacture can include creating multiple discrete layers of the composite metal surface, each with a different ratio of binder to metal powder. The methods of manufacture can include magnetizing the mold cavity to draw high permeability particles towards one side of the composite metal surface. In one embodiment, the bulk conductivity of the composite metal surface is in the order of $10^{-6}$ Mohs. In one embodiment, the bulk permeability of the composite metal surface is between about 0.95 and 2.

These and other features of the invention will be more fully understood and appreciated by reference to the description of the embodiments and the drawings.

BRIEF DESCRIPTION OF THE DRAWINGS

FIG. 4 illustrates one embodiment of a composite metal surface incorporated as the back of a mobile telephone.

FIG. 5A illustrates an embodiment of a composite metal surface snap fit into a metal surface of the back of a mobile telephone.

FIG. 5B illustrates another embodiment of a composite metal surface snap fit into a metal surface of the back of a mobile telephone.

FIG. 5C illustrates one embodiment of the snap fit configuration of FIGS. 5A and 5B.

FIG. 6A illustrates an embodiment of a composite metal surface screwed into a threaded aperture in a metal surface of the back of a mobile telephone.

FIG. 6B illustrates one embodiment of the threads in the metal surface and the composite metal surface of FIG. 6A.

FIG. 7A illustrates a top view of a composite metal surface of an inductive power supply with a multiple coil array.

FIG. 7B illustrates a side cutaway view of a portion of the inductive power supply of FIG. 7A.

DESCRIPTION OF EMBODIMENTS

Figure 1:
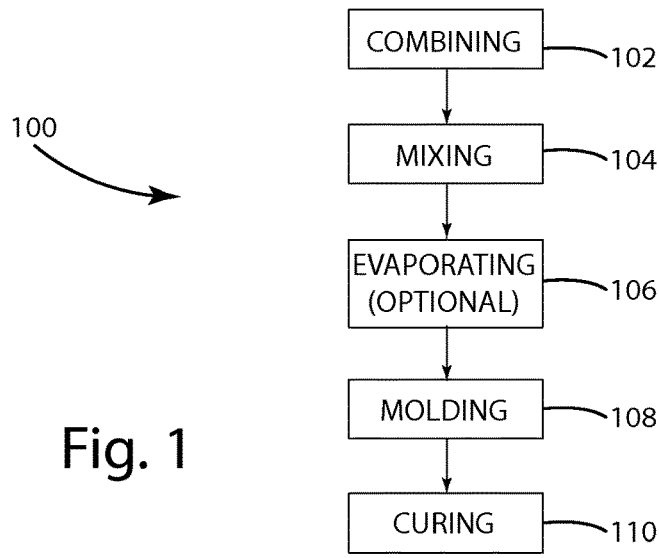
FIG. 1 is a flowchart illustrating one embodiment of a method of manufacturing a composite metal surface.

A flowchart for a method for manufacturing a composite metal surface in accordance with an embodiment of the present invention is illustrated in FIG. 1 and generally designated 100. The method 100 generally includes the steps of 1) combining 102 metal powder (in this embodiment aluminum powder), binder, solvent (optionally), and lubricant (optionally); 2) mixing 104 at least the aluminum powder, binder, solvent, and lubricant to create a mixture; 3) evaporating 106 if the mixture includes a solvent, for example by heating and/or applying a vacuum to the mixture; 4) molding 108 the mixture to form a composite metal surface; and 5) curing 110 the composite metal surface at a temperature sufficient to cure the binder. Although the materials are all combined, the combination need not take place just before the mixing or at the same time. In some embodiments, the particle size of the mixture may be controlled before pouring the mixture into the mold cavity, for example by sieving. Controlling the particle size of the mixture may include controlling the size of the agglomerations in the mixture.

Some embodiments of the composite metal surface may be manufactured using non-ferromagnetic metal powder. In the current embodiment, aluminum powder is used because it provides an aesthetically pleasing metallic look and has desirable magnetic characteristics when formed into a composite metal surface. For example, the high purity aluminum powder used in the current embodiment has a permeability that permits effective transfer of electromagnetic fields. That is, the aluminum powder of the current embodiment has a permeability close to air (i.e. about 0.95 to 2 relative permeability or about 1.257 micro-henry per meter), and particle conductivity close to that of solid aluminum. The bulk permeability of the composite metal surface is sufficient to allow effective passage of electromagnetic field. In the current embodiment, the bulk relative permeability is between 0.95-2.

In alternative embodiments, essentially any metal powder may be used such that the resultant composite is non-ferromagnetic (i.e. a relative permeability about equal to 1). In some embodiments, even a ferromagnetic metal (or metal-like) powder (i.e. relative permeability greater than 2) can be utilized instead of non-ferromagnetic metal powder and still arrive at a resultant composite that is non-ferromagnetic. The ferromagnetic metal powder can be diluted by using a higher ratio of binder (i.e. resin/epoxy) or a mixture of ferromagnetic and non-ferromagnetic powder, or both, so that the effective bulk permeability still allows the effective transmission of electromagnetic fields. That is, that the bulk relative permeability is approximately 0.95-2. Although the discussion throughout the application refers to non-ferromagnetic metal powder, ferromagnetic metal powder may be appropriate assuming the bulk permeability can be addressed by diluting the permeability with a higher ratio of binder. Accordingly, throughout the application it may be possible to utilize ferromagnetic metal powder in certain circumstances.

In general, materials that provide a metallic look have relatively high conductivity, which can be undesirable for the transfer of electromagnetic fields due to the generation of eddy currents. By insulating the metal powder with binder, the bulk conductivity of the resultant composite metal sheet can be reduced thereby reducing the amount of eddy currents produced by the composite metal surface when passing an electromagnetic field. In the current embodiment, the composite metal surface has an impedance in the order of mega ohms ($10^6$), which means that the conductivity is in the order of $10^{-6}$ Mohs.

The particle size of the non-ferromagnetic metal may vary depending on the application. In the current embodiment, aluminum powder particles between 44 and 500 microns are utilized to achieve the composite metal surface. In alternative embodiments, a different size range of particles may be appropriate, depending on the desired magnetic properties and the desired aesthetics. Other types of aluminum powder or combinations of different types of aluminum powder may be used in different embodiments for cost reasons or to achieve certain desired properties of the composite metal surface. For example, by varying the particle size, one can change the granularity of the composite piece. In general, the larger the particle size, the more pressure to create a continuous-looking piece.

In alternative embodiments, other non-ferromagnetic metals may be used, such as copper powder, titanium powder, magnesium powder, stainless steel powder or bismuth powder. Use of different non-ferromagnetic metals may enable use of different binder percentages without degrading the performance of the composite metal surface. It may be appropriate to modify the curing process depending on the type and amount of non-ferromagnetic metal and binder utilized in manufacturing the composite metal surface. Further, adjustments to the curing process may be appropriate depending on the particular powder and binder percentages to avoid inadvertently eliminating the insulation around the non-ferromagnetic metal powder or to adjust other characteristics of the surface.

The particle size and distribution may be customized based on the particular application. Each particle can have a particle conductivity that causes eddy current losses, in addition, the composite metal surface can also have a bulk conductivity with eddy current losses. The size of the particle generally affects the particle conductivity and the distribution and amount of the particles generally affects the bulk conductivity. In the current embodiment, the particle conductivity is low because the size of the particles are generally fairly small, i.e. the diameter of the metal particles is generally smaller than the composite metal surface's skin depth at the operating frequency of the electromagnetic field passing through the surface. Increasing the size of the particles can reduce or eliminate the bulk conductivity, but may result in an increase in the individual particle conductivity and eddy current losses.

In the current embodiment, a single type of non-ferromagnetic metal and binder is utilized, but in alternative embodiments, bimodal or other customized particle distributions may be utilized. For example, a combination of aluminum powder and other non-ferromagnetic powder may be used to manufacture a composite metal surface with desired characteristics for a specific application. In alternative embodiments, blends of other powdered materials may be suitable in order to achieve a low bulk permeability and a low bulk conductivity. For some embodiments, the individual particle conductivity and permeability are not relevant assuming that the resultant composite metal surface has a bulk permeability close to air and a low conductivity so that electromagnetic fields can pass without substantial losses.

The composite metal surface may be manufactured using essentially any binder capable of binding together the non-ferromagnetic metal to form a composite metal surface. A binder is a material used to bind together materials in a mixture. Examples of binders suitable for use in the present invention include thermoset polymers, thermoplastic polymers, or any other binder capable of binding together any powdered metals to form a composite metal surface. Examples of thermoset polymers include epoxide (sometimes referred to as epoxy), Bakelite, and Formica. Epoxy is the binder used in the current embodiment. Epoxy is formed from reaction of an epoxide resin with a polyamine. The current embodiment uses a latent cure epoxy. It is a solid at room temperature, when the two monomers are combined, but do not cure to a cross-linked resin until heated. The resin and catalyst may be pre-combined or combined at the same time with the other materials before mixing, as in the current embodiment. The current embodiment utilizes the Epikure epoxy system. Specifically, the current embodiment utilizes the Hexion Epon SU-8 Resin with Epikure P-104 curing agent. In alternative embodiments a different epoxy or other binder system can be used.

The amount of binder utilized in manufacturing the composite metal surface can vary depending on the application. In general, more binder will provide more strength to the resultant composite metal surface.

A solvent may be utilized as a carrier to disperse the binder within the aluminum powder. In the current embodiment, acetone is used as a solvent in order to dissolve the epoxy binder. In alternative embodiments, a different solvent may be utilized to disperse the binder. In the current embodiment, once the binder is dissolved in the solvent and mixed in the process, the solvent is evaporated.

Mixing a small percentage of binder with the powdered non-ferromagnetic metal can cause agglomerations to form in the mixture. Fine powders do not flow well and when poured into a mold cavity the fine particles tend to trap air. Relative to fine powders agglomerates can have better fill and flow characteristics. Depending on the makeup of the mixture, the size of agglomerations may be within a desired range, for example between from 75 and 430 microns. Depending on the makeup of the mixture, it can be beneficial to sieve the mixture to remove the smaller agglomerates and/or smaller particles and further improve fill and flow characteristics. For example, sieving may be utilized to achieve agglomeration sizes between 75 and 430 microns. In addition, certain agglomerates can provide certain magnetic, thermal, aesthetic and mechanical properties to the resultant composite metal surface.

In embodiments that utilize lubricant, the lubricant generally provides three primary functions 1) lubrication between the agglomerated particles, which allows the mixture to flow more quickly and fill the mold cavity with more uniformity; and 2) reduction in the non-ferromagnetic metal particle-to-particle conductivity in the finished composite metal surface; and 3) lubrication between the non-ferromagnetic metal particles during the molding operation. In one embodiment, Caplube G may be used as a lubricant.

The materials may be mixed in a conventional mixer and essentially any mixing technique may be utilized that mixes thoroughly enough and for a sufficient time to dissolve the binder in the solvent. Materials may be added in different orders and at different times throughout the mixing process.

A variety of evaporation techniques may be used in order to evaporate the solvent, if a solvent is utilized. In the current embodiment, the mixer includes a jacket where hot water or steam may be passed to heat the material in the mixer. The mixer of the current embodiment also includes a pump to obtain a vacuum within the mixer. As the solvent evaporates, the mixture dries into a powder, where there may be agglomerations of binder particles and non-ferromagnetic metal particles.

The powder may be directly poured into a cavity for molding or sieved to control the particle and/or agglomerate size. In one embodiment, powder is processed until a sufficient amount of solvent is evaporated such that the powder is dry and may be sieved. In an alternative embodiment, the sieving step is skipped and a less refined powder may be poured into the mold.

Figure 2:
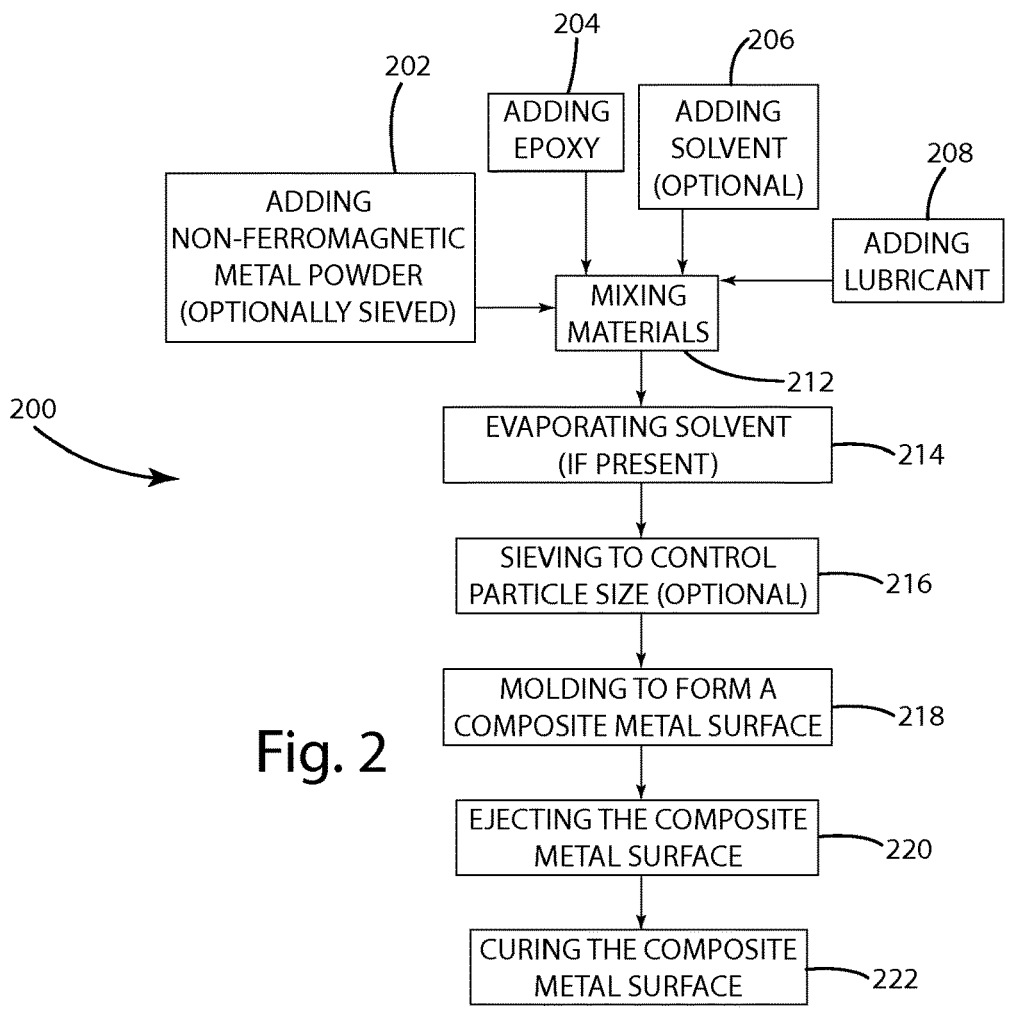
FIG. 2 is a flowchart illustrating another embodiment of a method of manufacturing a composite metal surface.

A flowchart of another embodiment of a method for manufacturing a composite metal surface is illustrated in FIG. 2, and generally designated 200. The method includes the steps of 1) adding aluminum powder to a mixer 202; 2) adding binder to the mixer 204; 3) adding solvent to the mixer 206 (optionally); 4) adding lubricant to the mixer 208; 5) mixing the materials 212; 6) evaporating the solvent 214 (if present); 7) sieving the mixture to control particle size 216; 8) compression molding to form a composite metal surface 218; 9) ejecting the composite metal surface 220; and 10) curing the composite metal surface 222. One difference between this embodiment of the method for making a composite metal surface and the FIG. 1 embodiment is that the mixture is sieved to control the particle size. The sieving can be a one or two stage process that can remove particles that are too large and/or too small.

The mixture may be sieved to remove particles or agglomerates that are larger than a threshold, smaller than a threshold, or both. Narrow particle distributions will typically fill the mold more consistently and reliably. In one embodiment, the powder particles and agglomerates that are below a designated threshold are removed. Removal of fine particles leads to a better increased uniformity in filling the mold. Air can be trapped more easily by the smaller particles, so removing them from the mixture can be beneficial to the mold filling operation.

In one embodiment, if needed, large particles and agglomerates are removed with a 40 mesh US Standard Sieve (430 microns) and fine particles are removed with a 200 mesh US Standard Sieve (75 microns). Large agglomerates may be ground or crushed and added to the mixture and the smaller particles can be recycled back into future batches. In alternative embodiments, different size meshes or other sieving devices may be used to achieve different size particles in the mixture.

The size of the particles can impact the look of the composite metal surface. In general the smaller the particle size of the agglomerations (or of the individual ingredient particle sizes) the more like metal the surface will look. If particle sizes are above a certain threshold, the surface can look grainy. Different types of non-ferromagnetic metal powder can be blended to provide additional control of the resultant look of the composite metal surface. For example, by adjusting the amounts and particle sizes of different types of non-ferromagnetic materials (such as aluminum powder, copper powder, bismuth powder), a variety of factors effecting the overall look of the composite metal surface can be changed, such as color, depth, and sheen.

The process of polishing can positively impact the appearance of the part. This can take a somewhat dull initial part and increase its luster to create a shiny surface. A typical process as in any metal finishing process can be used, with an incremental approach taken with various levels of grit paper. One can work from a coarse to extremely fine paper. For example, in one embodiment, a 600 grit paper is initially used to remove any large surface inconsistencies, working in steps up to a 2000 grit paper or a final finishing step. If desired, a clear coat can be applied to create a glossy look on the composite. Score lines from the sandpaper can be removed in order to create a smooth finish.

Figure 3:
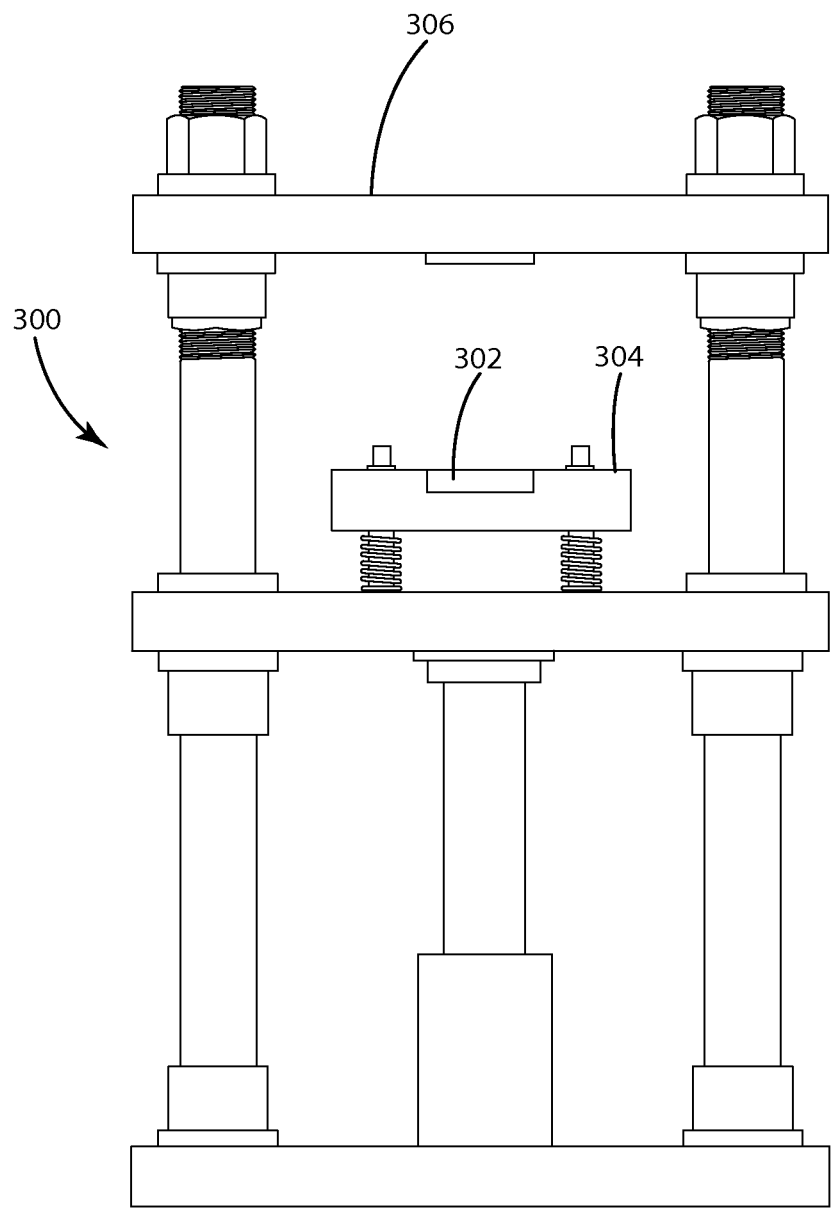
FIG. 3 is an illustration of an exemplary press used for compression molding a composite metal surface in accordance with an embodiment of the present invention.

A variety of different techniques may be used to mold the mixture to form the composite metal surface. In the current embodiment, the mixture is compression molded. An exemplary press 300 for compression molding is illustrated in FIG. 3. Simple or complex shapes may be molded through interchangeable molds, which can be used in conjunction with the mold cavity 302. The mixture, which in the current embodiment is in a powder form, is poured into the cavity 302 of the compression mold 304. Generally, the powder is measured into the mold by volume, and filled by gravity. Typically, the press 300 is kept at room temperature, but in alternative embodiments, the mold may be heated. In performing the compression, the upper die 306 is brought down and presses the powder to form a solid part. In the current embodiment, the pressure may range from about 10 to 50 tons per square inch. In the current embodiment, relatively low pressures are sufficient (~25 tons per square inch) to press a part with aluminum powder due to the ductility of the aluminum. In alternative embodiments, the pressure may be increased or decreased, depending on the application. For example, the amount of pressure used in the compression molding can impact the look of the composite metal surface. Less than 20 TSI can provide a more grainy appearance where individual aluminum particles can be distinguished in the surface and more than 20 TSI can provide a surface that looks more continuous, like a solid sheet of aluminum. That being said, changes in the binder content, type of metal, and a variety of other factors can influence the effects that the amount of pressure applied during compression molding has on the resultant surface.

Figure 12:
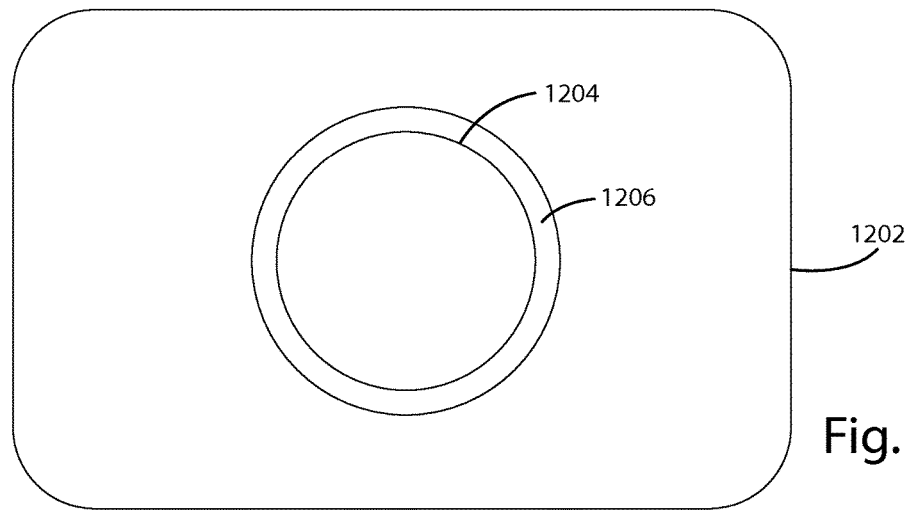
FIG. 12 illustrates how stamping and an existing housing structure can allow a simple way to merge a composite metal surface and a housing.
Figure 12:
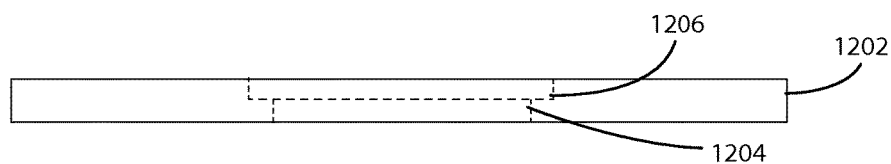
Figure 13:
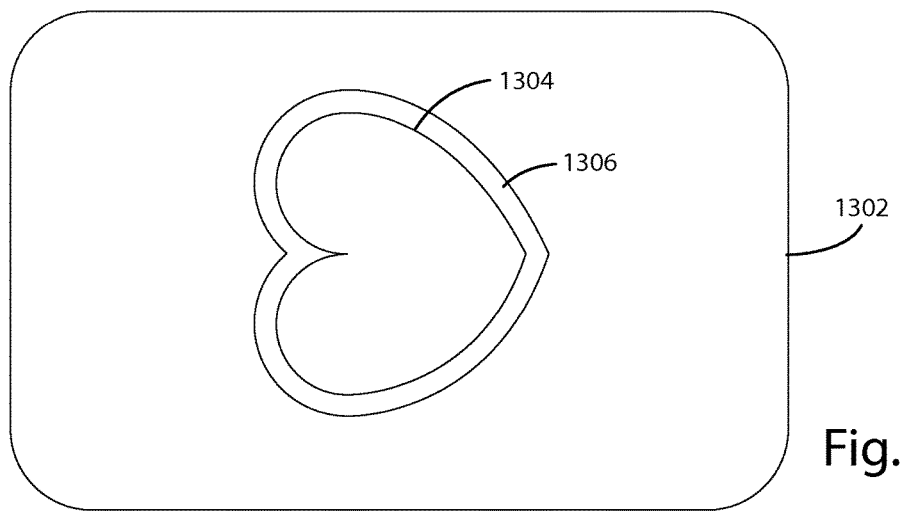
FIG. 13 illustrates how a logo or design shape can be compression molded into a housing to accent the design.
Figure 13:
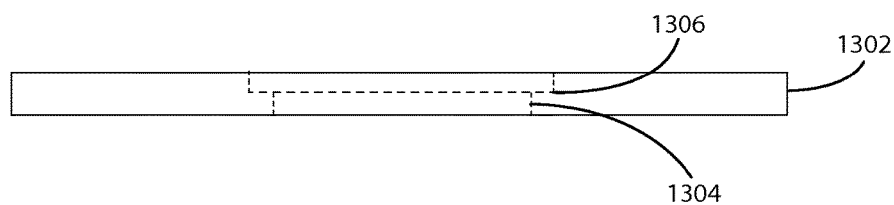

During the compression, pressure is applied to the agglomerations and the non-ferromagnetic metal particles within the agglomerations. The lubricant helps the individual particles of non-ferromagnetic metal move as they are compressed. This can help produce parts of increased density and compressibility, decreased deformation and induced stress in the finished parts. FIGS. 12 and 13 show two embodiments of electronic equipment housing ready to accept a composite metal surface. In FIG. 12, the electronic device enclosure housing 1202 is a metal housing with a circular electromagnetic aperture 1204. In the FIG. 12 embodiment, the mixture of powdered metal, epoxy, and lubricant can be poured into the aperture and then compression molded so that the composite metal surface is formed directly in the electromagnetic aperture. The FIG. 12 aperture includes a lip 1206 to provide additional surface area for the composite metal surface to join the metal housing. FIG. 13 illustrates how the aperture 1304 and lip 1306 can be a different shape, other than a circle, but the same general process can be applied wherein the mixture of metal powder can be poured into the space where the electromagnetic aperture is located and then compression molded to fill that aperture with a material that will look metallic and allow electromagnetic field to pass. The side view in FIG. 13 is merely representative in order to show the depth of the lip 1306 provided for increasing the surface area of the housing and to increase the strength of the joint between the metal housing 1302 and the composite metal surface. In some embodiment, the lip in the electromagnetic aperture may be eliminated, or, instead of a lip and electromagnetic aperture, the housing may only include a recess so that a coil and composite metal surface can be compression molded into the recess. Electrical contacts can be made through the metal housing to electronics located inside the device. In both of these embodiments, by fixing the metal housing and allowing the metal powder mixture to be compressed into the housing, a more seamless look and feel of the finished electromagnetic aperture can be provided. Polishing or other post treatments can improve the appearance and minimize the appearance of grains in the composite metal surface. If the pressure is high enough to visually remove the appearance of the grains (or the particle size low enough), the polishing can make the composite metal surface look more continuous due to the shine of the piece.

Although the current method is implemented using compression molding, alternatives to compression molding may be used. For example, extrusion techniques (such as ram extrusion), impact molding, or Ragan Technologies Inc. high-shear compaction are all examples of techniques that may be used instead of compression molding.

Once the compression molding is complete, the composite metal surface may be ejected from the mold. The composite metal surface may be cured or have other post treatment processes applied, before or after ejection. A number of post treatments may be appropriate to finalize the composite metal surface. In the current embodiment, temperature of about 200 degrees Celsius is applied to the composite metal surface in order to cure the binder. In alternative embodiments, the part may be partially cured through a heated mold and then receive a final cure after ejection from the mold. There may be other post treatments, such as heat activation, low temperature curing, drying, moisture curing, UV curing, radiation curing, or resin impregnation. Other treatments may include color treatments (color matching opportunities in the epoxy and or metal), chemical treatments, passivation, and anodizing. Some of these treatments are possible pre and post processing. Resin impregnation is a process where the composite metal surface is dipped or coated with a binder resin dissolved in a solvent, if appropriate. The porous parts of the composite metal surface are they filled with the binder resin. The solvent is evaporated, leaving the resin to give additional strength to the composite metal surface. Depending on the binder resin, a heat process may be used to cure the binder. Resin impregnation may be useful to increase the strength of the composite metal surface or reduce the amount of metal corrosion that occurs over time.

The various pre and post processing treatments mentioned above can be applied to adjust the magnetic or aesthetic properties of the resultant composite metal surface. For example, in one embodiment, color treatments may be applied in order to better match the composite metal surface to a metal surface.

In one embodiment, the composite metal surface can be press fit into a continuous grain metal, and then the surface as a whole could be buffed, polished and a coating could be applied to both simultaneously.

Figure 9:
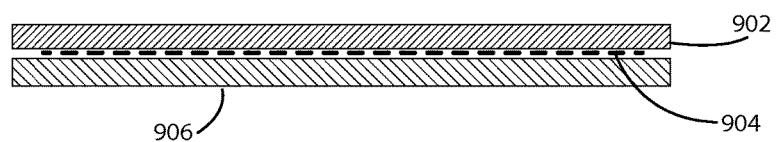
FIG. 9 illustrates a side cutaway view of a portion of an inductive power supply.
Figure 10:
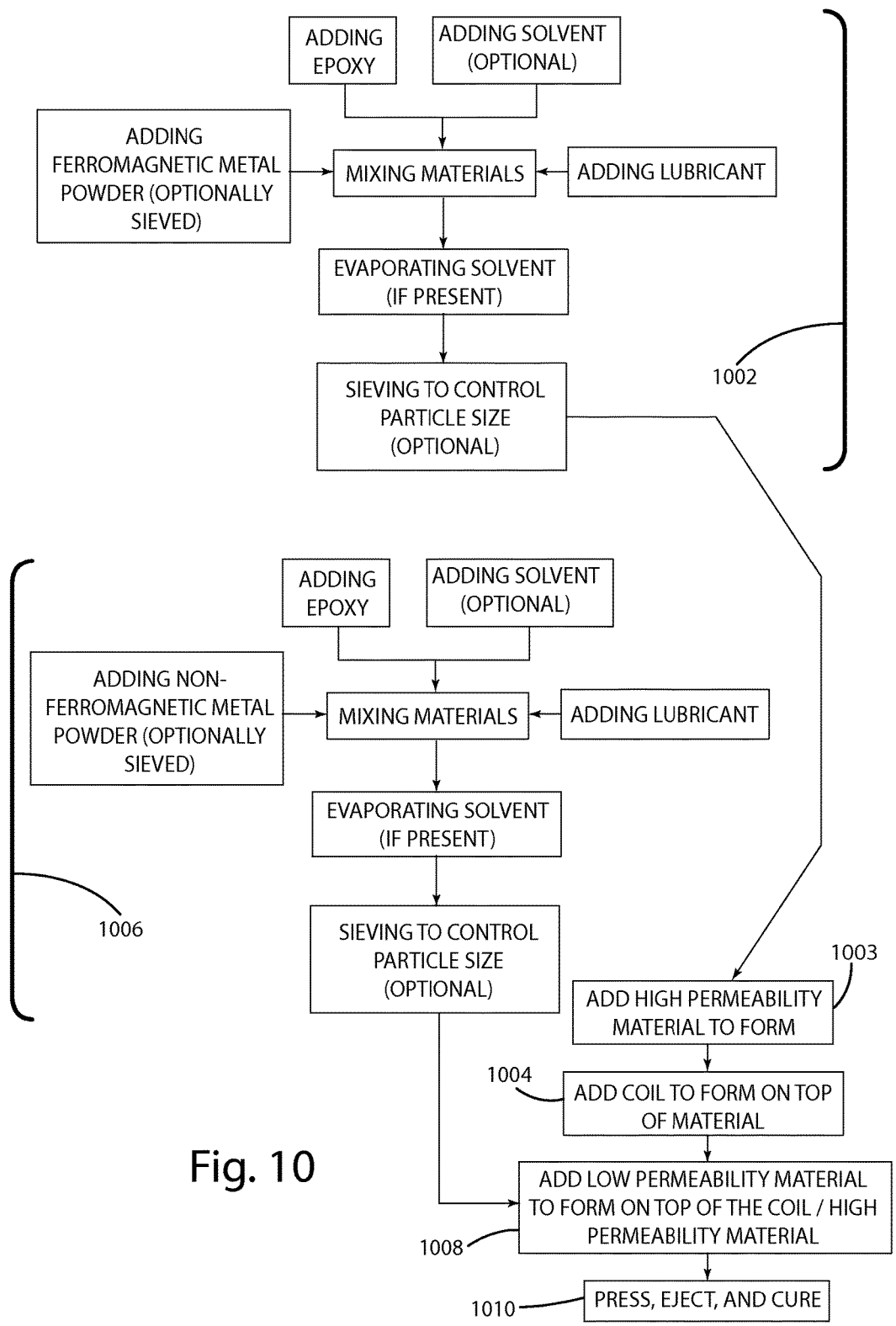
FIG. 10 is a flowchart illustrating one embodiment of a method of manufacturing a surface assembly.

Referring to FIGS. 9-10, in one embodiment, a composite metal surface can be co-molded with a coil, and a flux concentrator or shield. FIG. 9 shows a representative illustration of a portion of a surface assembly that includes a composite metal surface 902, a coil 904, and a flux concentrator 906. The assembly shown in FIG. 9 can be created with a single compression molding process and provides a surface assembly for use in electronic equipment. The surface assembly provides a coil sandwiched between a composite metal surface with a metallic look that can transfer electromagnetic fields and a flux concentrator (or shield) that can route or prevent electromagnetic radiation. Electrical contacts and traces can be utilized to route electrical power to and from the sandwiched coil. This configuration provides an assembly that can be installed in electronic equipment to provide a shielded coil with an already installed and predefined electromagnetic field aperture.

FIG. 10 illustrates a flow chart that describes one embodiment of a process for manufacturing a surface assembly such as the one described in connection with FIG. 9. A mixture of ferromagnetic metal powder, epoxy, and lubricant is mixed 1002 and poured into a mold 1003. A coil is placed on top of the mold 1004 and then a mixture of non-ferromagnetic metal powder, epoxy, and lubricant 1006 is poured on top of the coil and ferromagnetic metal powder mixture 1008. The entire assembly can then be compression molded at one time, ejected, and cured 1010. In alternative embodiments, the order of the ferromagnetic and magnetic powder can be switched.

The composite metal surface may be co-molded, extruded, or laminated for strength using a suitable material. As shown in FIGS. 7 and 8, a layer of strengthening material 706 may be laminated on one side of the composite metal surface 700. The strengthening material can be essentially any material that allows passage of electromagnetic field, for example, a material that has low conductivity and a permeability close to that of air. For example, glass fiber, plastic or Mylar film, Kevlar, or a different composite may be co-molded, extruded, or laminated on or with the composite metal surface.

Referring to FIGS. 4-6, a number of different embodiments of the back of a cellular telephone are depicted incorporating one embodiment of a composite metal surface.

FIGS. 4-6 are representative illustrations and are not drawn to scale. Further, FIGS. 4-6 do not depict all of the various features that the back of a cellular telephone may include, such as a camera lens, an insignia, a headphone jack, buttons, or connectors.

As mentioned above, incorporating the composite metal surface into a cellular telephone is just one possible application of the composite metal surface. The composite metal surface can be incorporated into a variety of different electronic equipment including, but not limited to telephones, remote controls, battery doors, keyboards, mice, game controllers, cameras, laptops, inductive power supplies, and essentially any other type of electronic equipment. The composite metal surface can replace or augment essentially any metal surface in order to allow an electromagnetic field to pass while still providing a metallic look. Further, the composite metal surface can replace any insert used in a metal surface to allow an electromagnetic field to pass, thus allowing a metallic look to the entire surface including where the insert previously was located.

FIGS. 4-6 include a generic antenna, which is located behind the composite metal surface. The antenna is drawn as a coil in each of these figures that could be utilized for inductive power reception. In alternative embodiments, the antenna could be a wireless communication antenna with a different shape and different dimensions. The antenna could be another type of antenna capable of transmitting or receiving electromagnetic signals. Although only a single antenna 404 is depicted in the current embodiment, in alternative embodiments multiple antennas can be included. The associated circuitry with any antenna in the electronic equipment is not being described in detail because the systems are generally known in the art. For example, various inductive power systems and wireless communication systems are described in the following U.S. Patents and US Patent applications: U.S. Pat. No. 6,825,620, which is entitled "Inductively Coupled Ballast Circuit" and issued Nov. 30, 2004, to Kuennen et al; U.S. Pat. No. 7,212,414, which is entitled " Adaptive Inductive Power Supply" and issued May 1, 2007, to Baarman; U.S. Ser. No. 10/689,148, which is entitled "Adaptive Inductive Power Supply with Communication" and filed on Oct. 20, 2003 to Baarman; U.S. Ser. No. 11/855,710, which is entitled "System and Method for Charging a Battery" and filed on Sep. 14, 2007 by Baarman; U.S. Ser. No. 11/965,085, which is entitled "Inductive Power Supply with Device Identification" and filed on Dec. 27, 2007 by Baarman et al; U.S. Ser. No. 12/349840, which is entitled "Inductive Power Supply with Duty Cycle Control" and filed on Jan. 7, 2009 by Baarman; U.S. Ser. No. 12/949,317, which is entitled "Multiple Use Wireless Power Systems" and filed on Nov. 18, 2010 by Baarman-each of which are incorporated herein by reference in their entirety.

Referring to FIG. 4, the entire back of the cellular telephone 400 is made from composite metal surface 402 described above. By making the entire back surface of the cellular telephone 400 from composite metal, the telephone design can attain a sleek and uniform metallic look while allowing electromagnetic field to pass. In this embodiment, there cannot be a mismatch in the metallic look of a metal shield and the composite metal because there is no visible metal shield. If shielding is desired, a layer of shielding can be located below the composite metal surface to shield any desired portions. One advantage to this approach is that the visual appearance of any shielding can be disregarded because it will not be visible below the finished composite metal surface.

The antenna 404 depicted in FIG. 4 is an inductive power receiver. The inductive power receiver can receive electromagnetic energy through the composite metal surface 402. The coil can be fastened directly to the composite metal surface and contained within the cellular telephone. Alternatively, the coil can be mounted to another component of the cellular telephone. Because the entire back of the cellular telephone 400 in this embodiment is made from the composite metal, the coil can be located practically at any location within the device because there is no shielding in the depicted embodiment to interrupt electromagnetic field from reaching the antenna.

Referring to FIG. 5A-5C, the back of a cellular telephone is depicted with a portion of the back including a metal shield surface 502 and another portion including a composite metal surface 504. FIG. 5A depicts a rectangular composite metal surface and FIG. 5B depicts a circular composite metal surface, both sized to cover an area larger than the antenna 506. The dimensions (including width, height, and thickness) and density of the composite metal surface can vary depending on the application. In one embodiment, the composite metal surface is about 0.3 mm thick. In another embodiment, the composite metal surface is about 2 mm thick. The composite metal surface 504 is manufactured to snap fit into the metal shield surface 502. As shown in FIG. 5C, the composite metal surface in the current embodiment includes tapered edges 508 that interact with tapered edges 510 of an aperture in the metal shield surface 502. The composite metal surface 504 can be installed in the metal shield surface 502 by aligning the composite metal surface 504 and applying pressure so that the tapered edges 508 of the composite metal surface 504 snap into place and mate with the tapered edges 510 of the metal shield surface 502. In alternative embodiments, a different fastening construction may be applied to join the composite metal surface 504 and the metal shield surface 504. For example, FIGS. 6A-6B illustrate a threaded screw relationship between the composite metal surface 604 and a metal shield 602. The composite metal surface 604 may include a slot 606 that can be used to screw the composite metal surface into the threaded aperture provided in the metal shield 602.

Figure 8A:
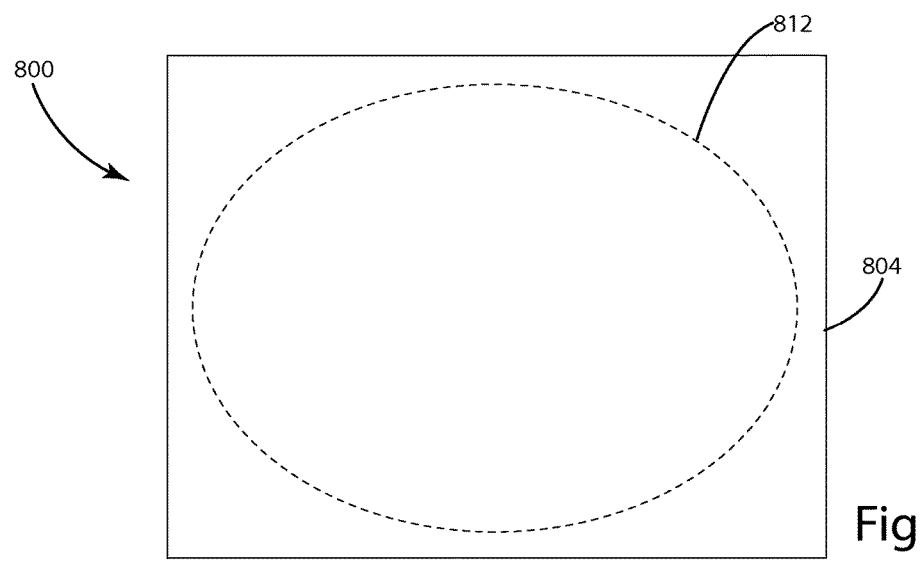
FIG. 8A illustrates a top view of a composite metal surface of an inductive power supply with a re-resonator coil.
Figure 8B:
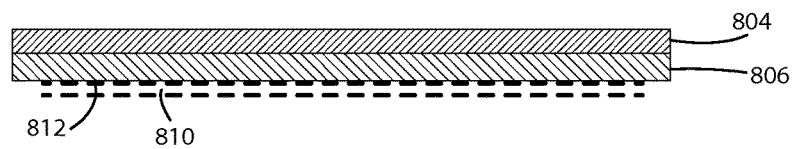
FIG. 8B illustrates a side cutaway view of a portion of the inductive power supply of FIG. 8A.

FIGS. 7A-B and FIGS. 8A-B illustrate incorporation of a composite metal surface into an inductive power supply. FIGS. 7A-B depict an inductive power supply 700 that includes an array of primaries 702 that can be energized to transmit wireless power to a secondary located in a remote device, such as a cellular telephone. FIGS. 8A-B depict an inductive power supply 800 that includes a primary coil 810 and a re-resonator coil 812. FIG. 7A and FIG. 8A illustrate representative top views of the respective inductive power supply embodiments and show that the entire surface of an inductive power supply can be a composite metal surface that allows transmission of electromagnetic fields, but appears metallic. The inductive power supply in FIG. 7A includes six primaries that are arranged in an overlapping fashion to provide electromagnetic energy to different regions of the surface. The inductive power supply in FIG. 8A includes a primary coil 802 and a re-resonator coil 803 that can enable transfer of electromagnetic energy over the composite metal surface.

With regard to the inductive power supply illustrated in FIG. 7A, the six primaries 702 illustrated are merely exemplary. In alternative constructions the inductive power supply can include additional or fewer primaries and they may be arranged differently.

FIGS. 7B and 8B illustrate representative cutaway side views of the respective inductive power supplies shown in FIG. 7A and 8A. In both embodiments, the composite metal surface 704, 804 optionally includes a non-conductive material 706, 806 laminated to the composite metal surface 704, 804 to provide additional support.

In one embodiment, the strengthening supporting structure 706 also doubles as a coil mount. The coils 702 in FIG. 7 can be attached to the composite metal surface via the supporting structure 706. In one embodiment, a supporting plastic structure can be glued to the bottom of the composite metal that allows the mounting of the coils. The plastic support can both provide a way to fasten the coils in position and also provide additional strength to the composite metal surface. The coils can be fastened to the supporting structure 706 by adhesive, screws, tape, or essentially any other fastener.

In an alternative embodiment without a supporting structure 706, the coils can be fastened directly to the bottom of the composite metal surface. The fastening can be achieved by adhesive, screws, tape, or essentially any other fastener. For example, in one embodiment bosses can be molded into the underside of the composite metal surface and a bracket can be used to secure the coils to the bosses.

In another alternative embodiment, the composite metal surface and the coils are joined to a common housing. For example the composite metal surface may have mechanical connectors that interact with the housing or may be co-molded or otherwise fastened to the housing. The coils may be braced against the housing or fastened in some other fashion to the housing so that the coils are positioned near the composite metal surface where the electromagnetic field can pass.

Figure 14:
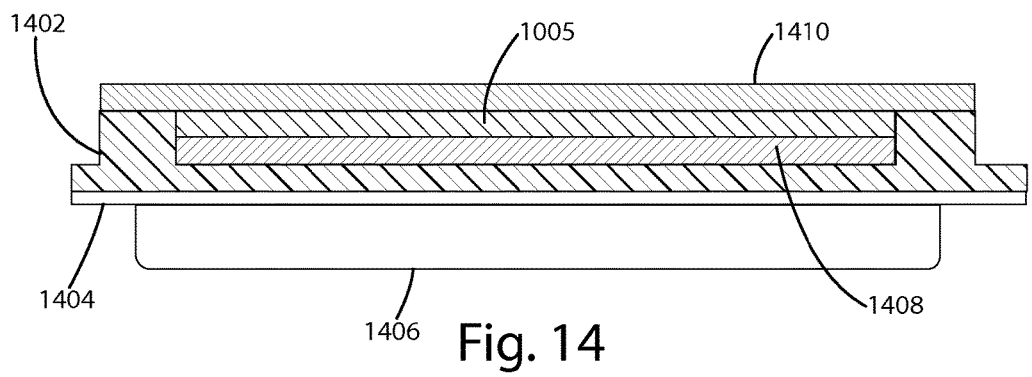
FIG. 14 show an example of a laminated support structure that holds the associated electronics and coil(s).

In one embodiment, a coil carrier element 1402 can be mounted or laminated with glue, tape, or laminating material 1404 to a composite metal surface 1406 such as a compressed powder material or a nonconductive surface element. The coil(s) 1408 can be attached to the coil carrier element 1402. The coil carrier element 1402 can be a plastic support and can have printed circuit board mounts to hold the printed circuit board assembly (PCBA) 1410 and the associated parts for easy assembly and better structural performance. A ferrite or other type of shield 1005 can be positioned between the PCB 1410 and the coil(s) 1408. One embodiment of such a configuration is illustrated in FIG. 14. The coil carrier element can be essentially any non-conductive material, such as plastic.

In some embodiments, a passivation process can be applied to the non-ferromagnetic powder. Passivation is the process of making a material passive, usually by the deposition of a layer of oxide that adheres to the metal surface. The passivation process can further enhance the magnetic properties of the non-ferromagnetic metal powder. Specifically, passivation can aid in the reduction of the bulk conductivity of the resultant composite metal surface and therefore reduce the eddy currents that are formed when passing an electromagnetic field through the composite metal surface.

Figure 11A:
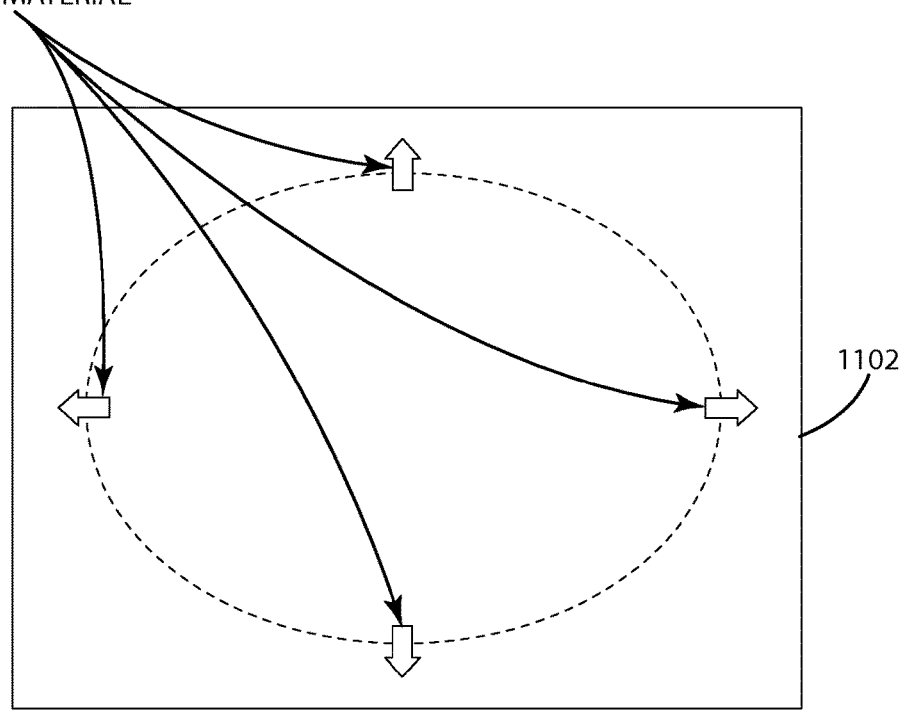
FIG. 11A illustrates heat dispersion throughout a composite metal surface in an inductive power supply.
Figure 11B:
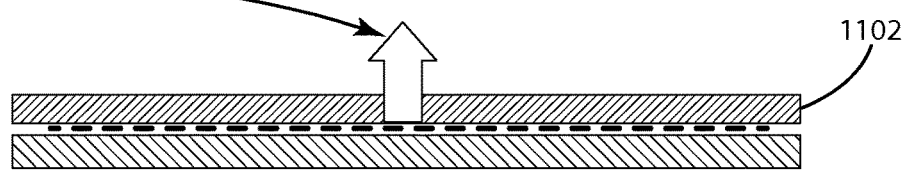
FIG. 11B illustrates heat dispersion throughout a composite metal surface in an inductive power supply.

In some embodiments, the composite metal surface can act as a heat sink for the heat produced by the antenna. The non-ferromagnetic metal powder in the composite metal surface can draw heat away from the coils. Further, as shown in FIGS. 11A-B, the heat can disperse through the composite metal surface 1102.

The composite metal surface provides a durable surface. Because the composite metal surface includes powered metal, the resultant surface not only provides a metallic look, but it also wears in a similar manner and duration as its non-composite metal counterpart. The surface is maintainable in a similar manner to a metal surface and has a high quality look and feel, similar to the look and feel of its non-composite metal counterpart surface. The composite metal surface can be polished easily and can last as long as the underlying metal the surfaces utilizes.

Some embodiments of the composite metal surface provide a non-conductive metal matrix that looks like a pure metal surface with attributes similar to a pure metal surface, except that the composite metal surface is virtually transparent to electromagnetic fields (including both RF electromagnetic fields and electromagnetic interference). For example, the composite metal surface may only have about 5% or less of an electromagnetic field lost in the composite metal surface. Although the amount of loss in the composite metal surface can depend on the thickness of the composite metal surface, the distance between the primary coil and the secondary coil of an inductive power supply are generally the dominant factors in power transfer efficiency, and not the thickness of the composite metal surface. That is, a material with a given conductivity can absorb more electromagnetic field the thicker it is, however, where the conductivity is relatively low, for example in the order of $10^{-6}$ Mohs, the losses due to thickness of the composite metal surface are relatively insignificant and typically are less than other losses in the system, such as the effects of increasing the distance between inductive power transfer coils. The composite metal surface can be used to hide or disguise wireless power primaries or secondaries or to hide or disguise RF antennas, or any other component that receives or transmits electromagnetic fields.

In some embodiments of methods of manufacturing a composite metal surface, multiple composite metal surfaces can be produced in a batch process. For example, some methods of manufacture can provide a continuous or linear process that is low cost and has a low number of manufacturing steps, which facilitate batch production of composite metal surfaces.

A batch composite metal surface manufacturing process can control the metallic look of the composite metal surface, the bulk conductivity of the composite metal surface, and the bulk permeability of the composite metal surface. Other physical, electrical, and magnetic properties of the composite metal surface can also be controlled by the batch manufacturing processes. Further, batch manufacturing methods can achieve a composite metal surface with a metallic look while having no or low conductivity, abrasion resistance, hardness similar to that of metal, and thermal conductivity properties similar to that of metals.

Figure 18:
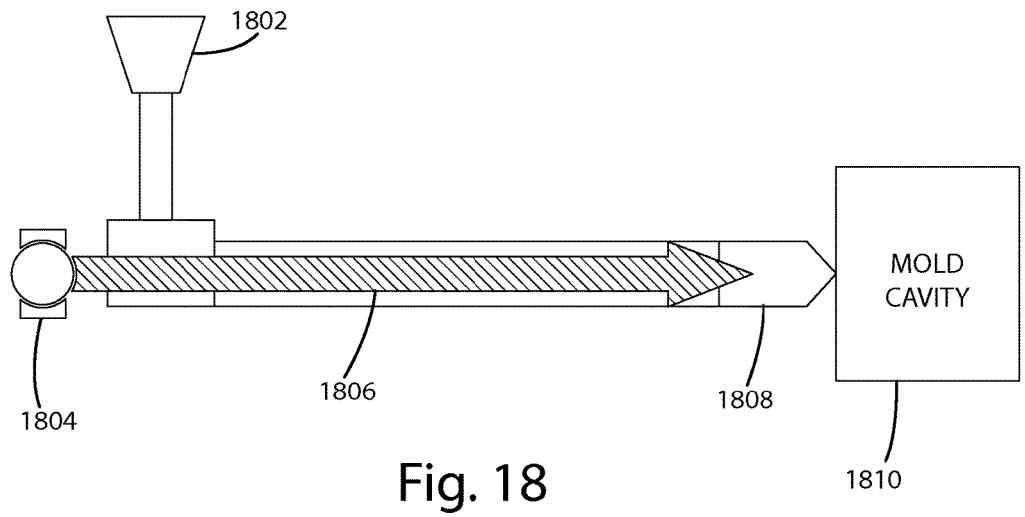
FIG. 18 shows one embodiment of a plastic injection mold process for manufacturing a composite metal surface.

One example of an injection molding process that can be used to batch manufacture composite metal surfaces is illustrated in FIG. 18. FIG. 18 shows a plastic injection mold process where a combination of insulated metal powder and plastic or binder pellets are fed into a hopper 1802. A screw motor 1804 powers the injection screw 1806 in order to injection mold a composite metal surface through the injection nozzle 1808 in a mold cavity 1810.

In one embodiment, the injection mold process utilizes a different type of binder than traditional metal injection molding. Metal injection molding typically utilizes a polymer/wax blend or softer polymer that burns off during a sintering process. By utilizing a thermoset polymer or one of the other binders discussed above instead of a low molecular weight polyethylene, a structural integrity can be obtained such that the composite metal surface is suitable for use as an electromagnetic aperture in a portable electrical device.

An alternative embodiment is mold decorating. A film, perhaps polyester, can have a coating applied to it that contains powder metal with the appropriate magnetic qualities applied to it. This can be printed on the film, sprayed, or applied by a process such as a silk screen. The coating can be a continuous layer or it can be in a pattern. The film is inserted in a mold with the metal facing where the polymer will be injected. The mold is closed and the polymer is injected.

A clear or opaque coating may also be used on the top surface of the material to better protect the parts as they are handled and used. A tinted or colored finish may also be used to vary the appearance. For example, a yellowish color can be added to the coating to make an aluminum looking material appear more like gold in nature.

Figure 15:
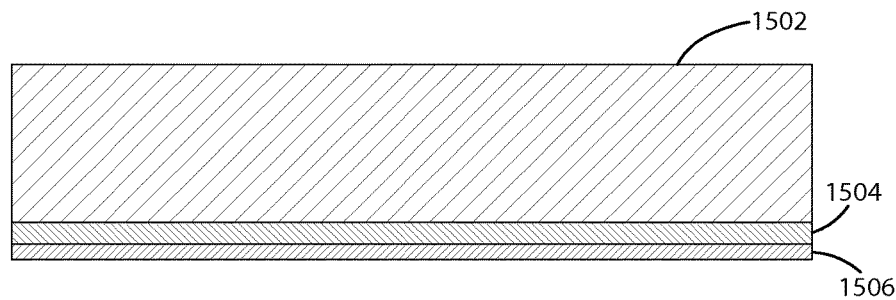
FIG. 15 shows one embodiment of a multi-layer composite metal surface.

In FIG. 15, one embodiment of a multi-layer composite metal surface is illustrated. The multi-layer composite metal surface includes an insulated powdered metal layer with 2-5% binder content 1502, an insulated powdered metal layer with 1-2% binder content 1504, and a non-insulated powdered metal layer with less than 1% binder content 1506. As with the embodiments described above, the type of powdered metal can vary from application to application. A layer can be referred to as insulated where the binder content is above 1% and non-insulated where the binder content is below 1%. The multi-layer composite metal surface uses a powdered metal with a plastic resin or binder that is layered to provide varying properties through the different layers of the material. The layers shown are a high binder content layer for rigidity and low bulk conductivity, and lower binder content layer for a more pure metallic look, and a medium conductivity layer created by non-oxides or non-coated particles with a very low binder content. In alternative embodiments, different number of layers may be provided.

In the current embodiment, the composite metal surface can have a surface finish that appears metallic with little to no distinguishable difference between the material and an actual piece of metal, but also provides little to no conductivity. In order to achieve this, the composite metal surface includes a thin layer having a low binder content and high metal powder content to give a metallic finish. The other layers can be manufactured with a higher binder content for increased strength and flexibility, while maintaining many of the visual properties of a metallic finish in case the top layer is scratched or damaged. In one embodiment, a thin conductive layer can be utilized as a surface finish that does not significantly impede electromagnetic energy transfer. For example, several embodiments of thin conductive material suitable for such a surface finish are disclosed in U.S. Patent Application No. 61/584,266, entitled "Wireless Power Transfer through Conductive Materials" filed on Jan. 8, 2012 by Van Den Brink.

Figure 16:
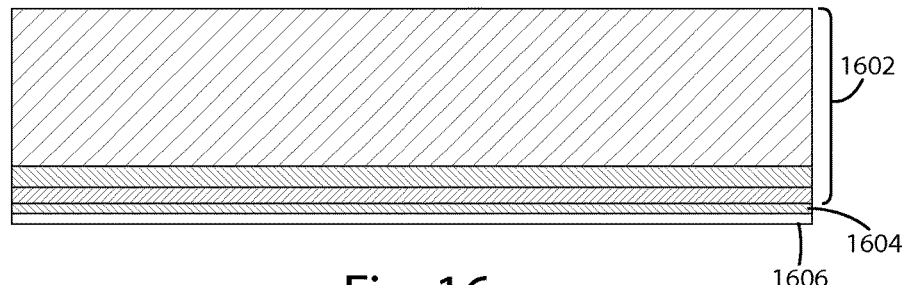
FIG. 16 shows another embodiment of a multi-layer composite metal surface.

FIG. 16 shows the same composite metal surface of FIG. 15, except the composite metal surface 1602 includes a thin layer of conductive film on the surface 1604. An optional clear protective coating 1606 is provided over the conductive layer to protect the surface finish. The conductive film can be sputter coated, vapor deposited, screen printed, or applied in essentially any other manner.

Figure 19:
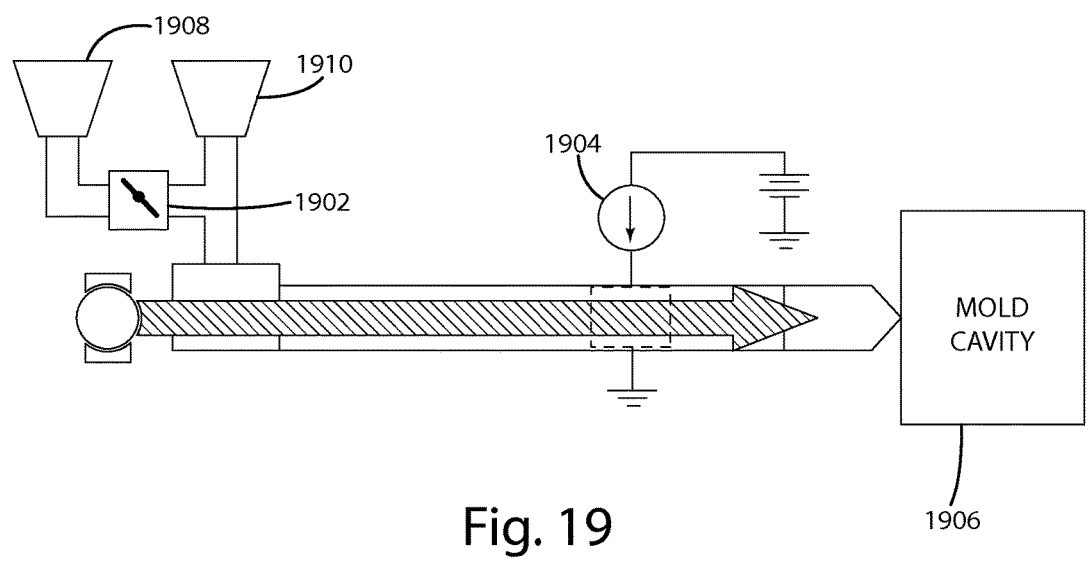
FIG. 19 shows another embodiment of plastic injection molding for manufacturing a composite metal surface.

To manufacture and control the various properties of the varying layers, a dual injection mold with two different materials being injected into the mold at the same time can be utilized, as shown in FIG. 19. In this embodiment, there is a control valve 1902 that controls how much metal powder is injected into the mold from the metal powder feed hopper 1908. A resistance sensor 1904 can be utilized to determine the ratio of metal powder to plastic resin from the plastic resin feed hopper 1910 and make adjustments to achieve the appropriate ratio. In alternative embodiments the control valve can control how much binder is injected into the mold 1906. In yet another embodiment, the metal powder and the binder can each have a control valve controllable by a sensor in the injection molding machine. Alternatively, a two step injection mold process can be utilized with two different cavities. In one embodiment, gravimetric feeders can be used assure the proper ratios of polymer and metal. Additionally, individual layers can be created using different calendaring or tape casting processes that then can be combined using a series of rollers.

Figure 20:
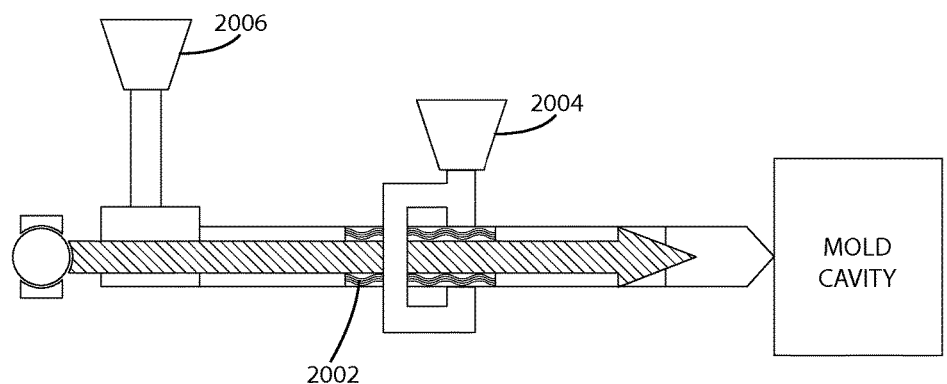
FIG. 20 shows yet another embodiment of a plastic injection molding for manufacturing a composite metal surface.
Figure 21:
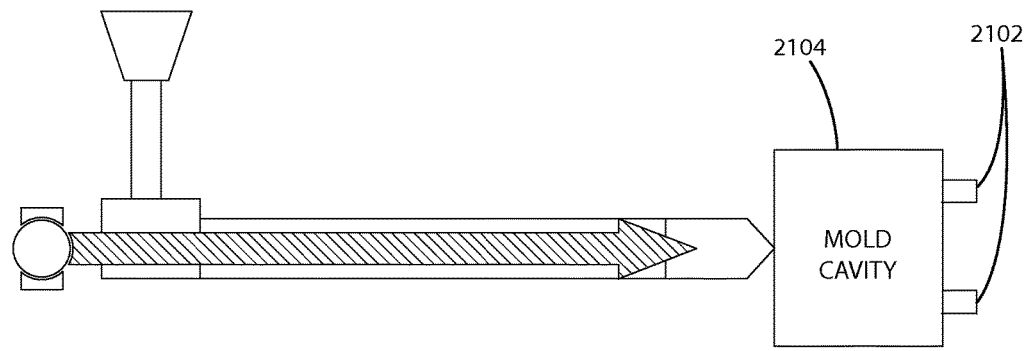
FIG. 21 shows another embodiment of plastic injection molding where the mold cavity includes magnets.

In an alternative embodiment, layers of the multi-layer composite metal surface can be manufactured by controlling mixing and injection patterns in an injection molding manufacturing process. FIGS. 19-21 illustrate a variety of such methods. In one embodiment, metal powder can be added late in the melt stage of an injection mold machine to increase the metal powder content towards the surface of the material, as shown in FIG. 20. FIG. 20 shows a dual hopper system where metal power is fed into an injection machine via a metal powder feed hopper 2004 during the melt stage 2002 of the plastic pellets, which are fed through a plastic resin feed hopper 2006 to ensure a more controlled mix quality of the material. In an alternative embodiment, as shown in FIG. 21, a magnet or electromagnet 2102 can be used in the mold cavity 2104 or cylindering process to draw high permeability particles towards the surface of the material as the bulk material is injected/pressed, or as it begins to cool.

Figure 17:
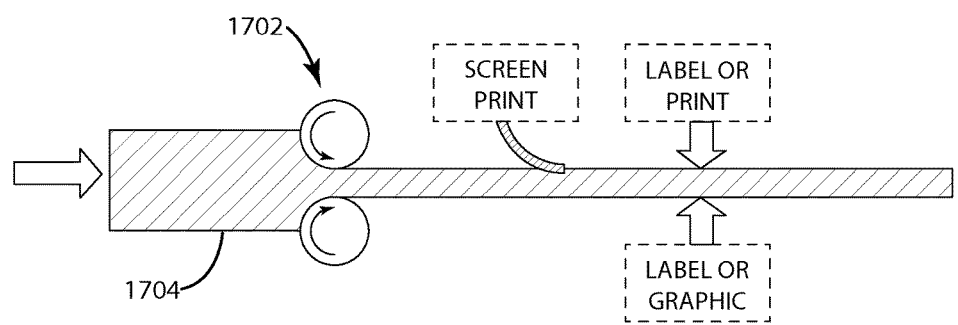
FIG. 17 shows one embodiment of a tape casting process for manufacturing a composite metal surface.

As shown in FIG. 17, spray coatings or silk-screening can be used to add a liquefied material that is either conductive or non-conductive to provide a very thin layer of material. In an injection mold machine, the spray coating can be sprayed in the mold cavity before a part is injected in order to deposit the material on the surface of the part. FIG. 17 shows a tape casting process where a material is put through a first set of rollers 1702 to compress the material 1704 into a more dense material of uniform thickness. This process may also optionally include a screen printing process, a label or graphic application process (on either side).

In one embodiment, the composite metal surface can be manufactured to shield certain frequencies of electromagnetic energy and permit effective transmission of electromagnetic energy at other frequencies. The composite metal surface can have certain electromagnetic properties by combining powdered metal materials and conductive coatings. By varying particle size, material composition, isolation techniques, and binder content, the bulk conductivity and bulk permeability can be controlled, and the characteristics of the suppression of electromagnetic waves passing through the resultant material can be tuned.

Figure 22:
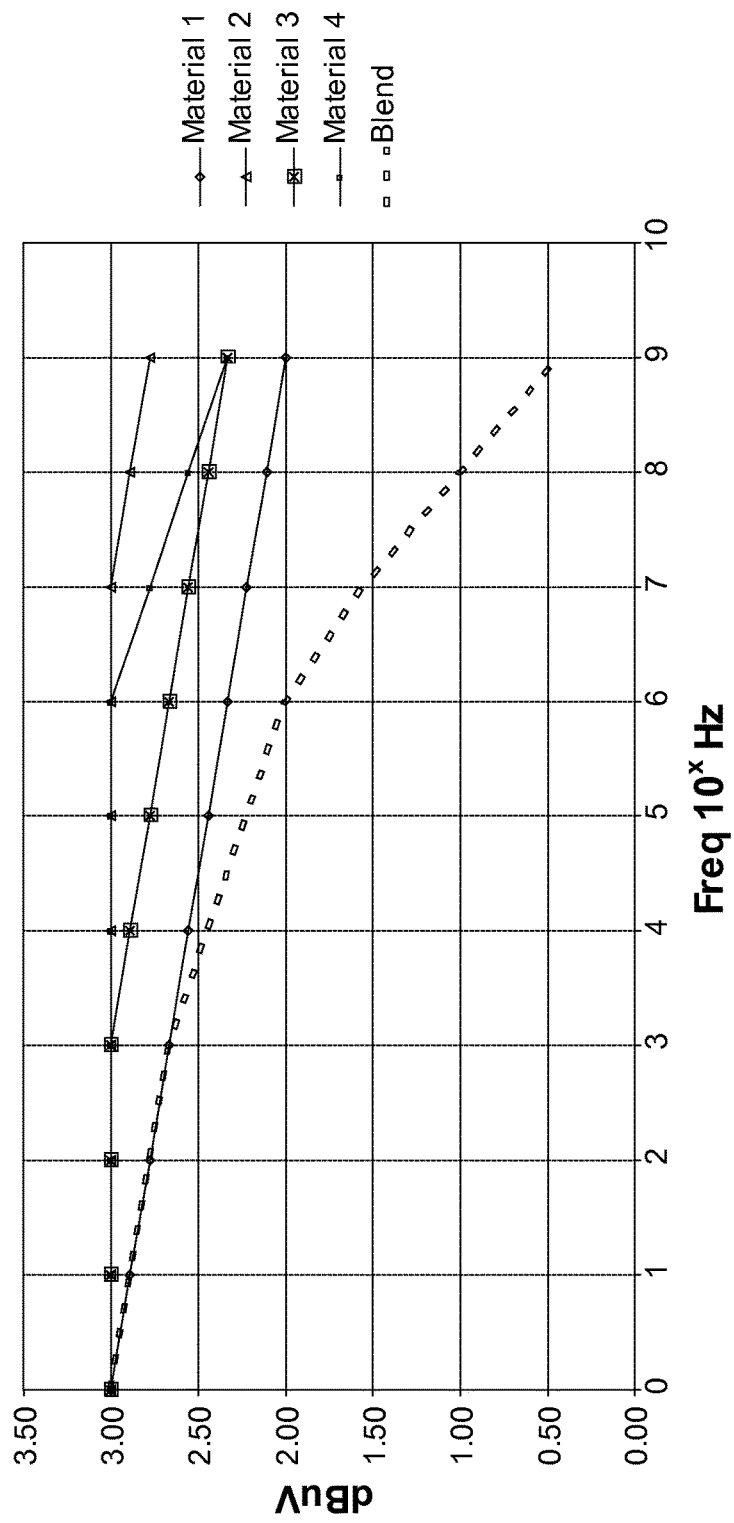
FIG. 22 shows the electromagnetic compatibility performance of several types of composite metal surfaces.
Figure 23:
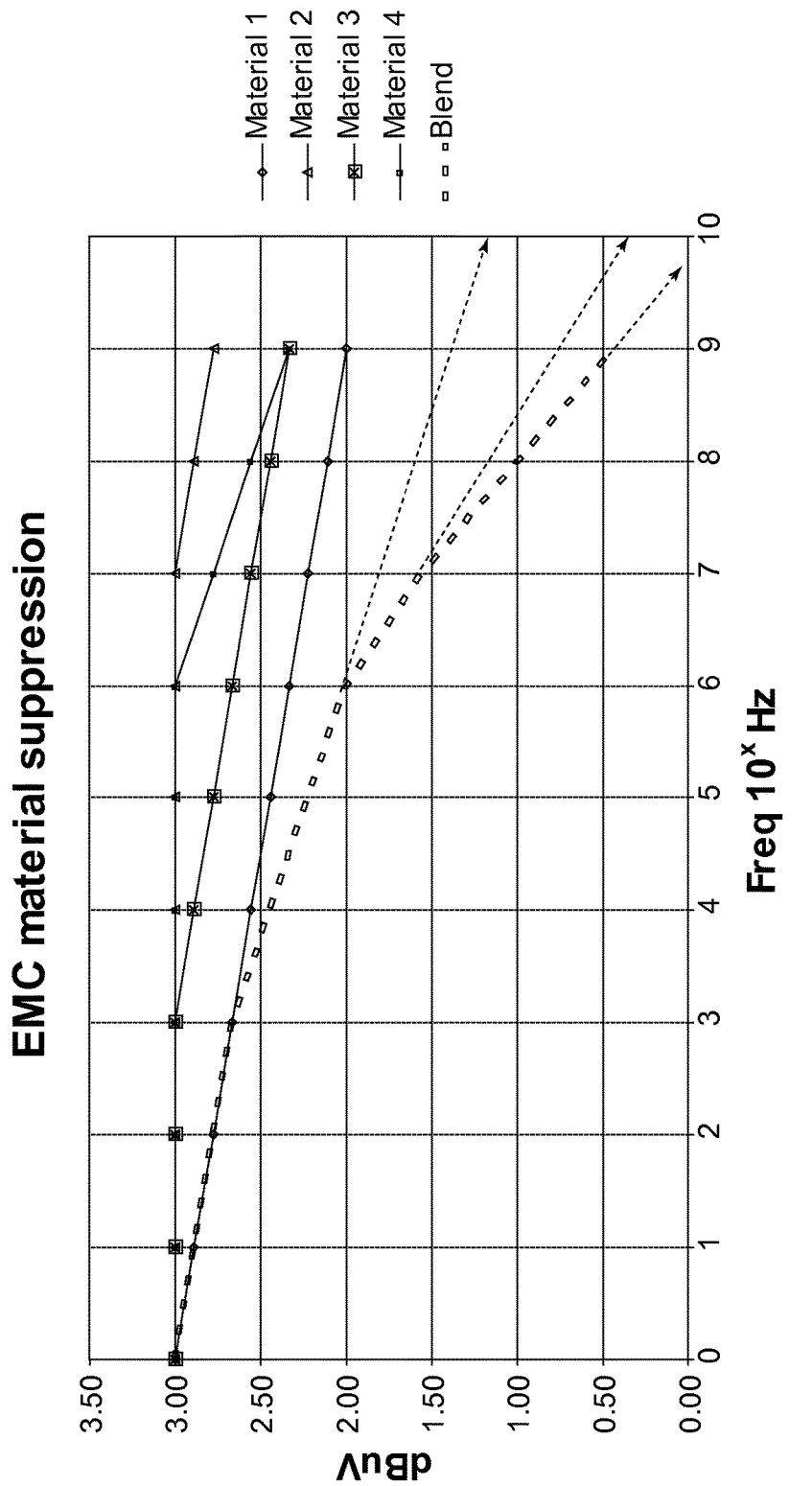
FIG. 23 shows the frequency breakpoints of several composite metal surfaces.

For example, in FIGS. 22 and 23, the theoretical response of several different materials are shown. FIG. 22 shows the electromagnetic compatibility (EMC) performance of several theoretical types of insulated powder materials that vary either in composition, grain size, or particle isolation properties, as well as the resulting performance of a material made of a blend of the varying materials. EMC graphs illustrate electromagnetic losses and electromagnetic absorption over frequency. Electromagnetic losses and absorption is sometimes referred to as insertion loss. FIG. 23 shows the frequency breakpoints of the blended material resulting from the introduction of materials with varying frequency responses.

Material 1 may be an aluminum powder with a certain grain size and bulk conductivity. By decreasing the particle size or the isolation properties of the particulates, the resulting material may begin to suppress electromagnetic fields at a higher frequency, such as material 3. By using two different layers, or by blending the two materials into one resulting piece, the resulting electromagnetic suppression can increase with frequency. When the frequency response of material 3 begins to take effect (at about $10^3$ Hz), the slope of the resulting blend increases, signaling that the material suppresses higher frequencies at a higher rate. Thus, a materials frequency response can be tuned by combining the characteristics of individual powders into a blend. The blend shown in FIG. 22, illustrates a combination of all four materials.

A composite metal surface may include an effective amount of metal powder to make the composite metal surface look metallic and an effective amount of metal powder to provide below a threshold level of electromagnetic losses at a frequency and provide above a threshold level of electromagnetic absorption a different frequency. Similarly, a method of manufacturing a composite metal surface may include selecting an effective amount of metal powder to provide below a threshold level of electromagnetic losses at a frequency and provide above a threshold level of electromagnetic absorption a different frequency. In some embodiments, the effective amount of metal powder can be selected to provide below multiple threshold levels of electromagnetic losses at a first set of frequencies and above multiple threshold levels of electromagnetic absorption at a different set of frequencies.

Figure 24:
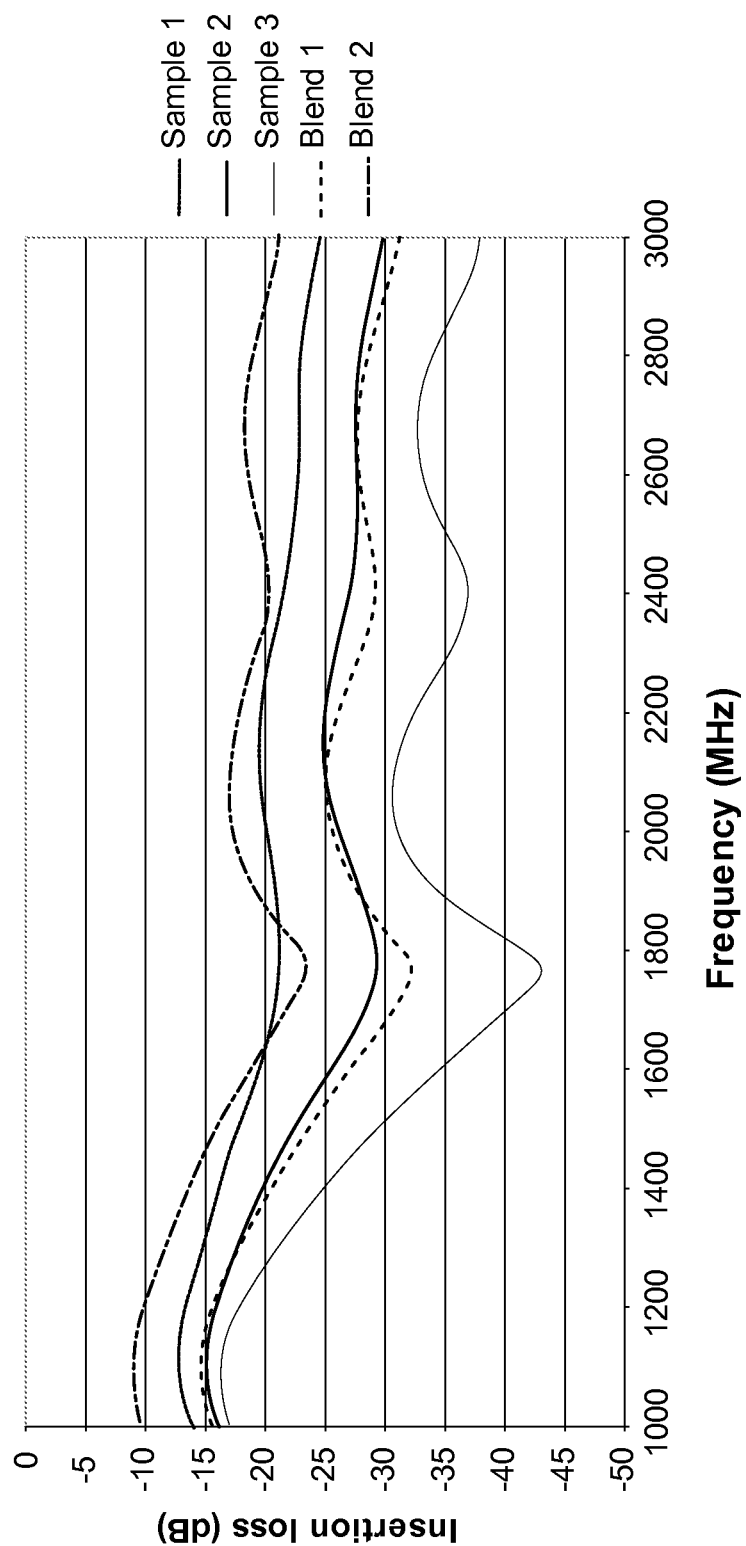
FIG. 24 illustrates a graph of insertion loss vs. frequency for three samples and two exemplary blends.

The EMC material suppression graphs illustrated in FIGS. 22-23 are shown at a large scale for frequencies from 1 Hz to $10^{10}$ Hz. The EMC material suppression graph illustrated in FIG. 24 is shown at a relative smaller scale (frequencies from 1000 MHz to 3000 MHz) and illustrates how material selection can influence the EMC properties on that scale. The type of metal powder, such as different aluminum powders, can influence the amount of absorption of field at a particular frequency. Material can be selected or blends of material can be selected to provide a composite metal surface with certain losses at certain frequencies and certain absorption at certain frequencies.

In FIG. 24, Sample 1 is a composite metal surface including Alfa Aesar 99.5% pure Al and 5% binder. Sample 2 is a composite metal surface including Ampal AMB 2712 Al and 5% binder. Sample 3 is a composite metal surface including Ampal AMB 625 Std Al and 5% binder. Each of the three samples shown in FIG. 24 includes the same amount of material by weight and the same amount of binder by weight. This is done for purposes of discussion. In use, the ratios of the amount of material by weight and the amount of binder by weight may be changed and the total amount of material and binder may be changed—both of which can change the electromagnetic properties of the composite metal surface.

Blend 1 is a blend of 50% of sample 1 and 50% of sample 3, with 5% binder. Accordingly, blend 1 has the same amount of total material and binder as the three samples. In contrast, blend 2 is a blend of 10% of sample 1 and 50% of sample 3—there is a 40% reduction in overall material thickness in blend 2. This results in an effective ratio of 15.8% Alfa Aesar 99.5% pure Al, 79.2% Ampal AMB 625 Std Al, and 5% binder. The binder content of blend 2 is still 5% by weight.

Sample 1 and sample 2 have less than 0.1% loss of power transfer through the material at 100 kHz (not depicted), whereas sample 3 has about 1-2% loss at 100 kHz. However, sample 3 absorbs more RF field in the cell band (1700-1800 MHz). By blending these samples to create a composite metal surface, losses can be reduced at certain frequencies and absorption at other frequencies can be increased. Sample 3 blended with sample 1 provides an alternative to sample 2 because it increases the absorption of the RF field by 3 dB at the cell band (1700-1800 MHz), which is twice the field absorption over sample 2, while keeping the frequency response nearly the same for the other frequencies that can pass (or in the case of NFC which is at about 13 MHz. Blend 2 increases absorption in the cell band and is a thinner material since it uses only 10% of the previous amount of the sample 1 and 50% of sample 2, while maintaining a 5% binder content. These are just a few examples. Different blends of materials can be made to balance losses at certain frequencies or frequency ranges, absorption at certain frequencies or frequency ranges, thickness of the material, and the aesthetic look of the composite metal surface.

By adding a thin conductive layer on the surface of the material, the frequency response can again be tuned since a conductive layer can also provide a linear frequency response, but can suppress electromagnetic fields at a lower frequency than the powdered metal materials.

If the blended and coated material is used in an inductive power system, or used as a cover for an antenna, the properties can be adjusted to alter the suppression characteristics at the frequency of the antenna fundamental operation. Further, the frequency response can be controlled to provide a steep roll-off above that frequency to suppress spurious emissions and side-bands created by the antenna and circuitry.

In some methods of manufacturing, the properties of the composite metal surface can be controlled during manufacture. Since materials can vary from supplier to supplier such as grain size, particulate conductivity, etc, as well as other environmental factors such as humidity and temperature, the resulting properties of the manufactured material can vary over time, even using the same method of manufacture. To control this, a sensor measuring bulk conductivity or permeability can be used in line with a calendar, tape caster, or injection mold cavity. This sensor can provide feedback to the mixing controller to adjust the blend of the materials to ensure tightly controlled physical or electromagnetic properties of the materials. One embodiment of such a system is illustrated in FIG. 19.

Composite metal surfaces can be post processed. For example, certain post-processing steps that can be performed following a high-shear process, such as milling or sanding. If a surface layer of a material that is formed of polymer bonded metal particles has been deformed in a way that the particles now form a continuous metal sheet with high electrical conductivity, the non-conductive bulk properties can be restored by ablating the top continuous layer, exposing polymer bonded metal particles below. This could be accomplished by laser ablation, chemical etching with a process that has higher activity on the metal than it does the polymer binder, sandblasting, wet or dry sanding, or polishing.

A composite metal surface can be casted. A polymer and powdered metal are heated and poured into a mold. In one embodiment, the polymer has a low molecular weight so that it has a low viscosity when it is molten. Examples of polymers include the Honeywell A-C™ Polyethylene Polymers. Many of these homopolymers and oxidized homopolymers have viscosities less than 1,000 centipoise at 140 C.

A mixture of 15% by weight Honeywell A-C Polyethyelene, Grade: A-C 820A can be mixed with 85% by weight Hoeganaes Corporation Ancorlam 1000 C, powdered iron and heated. The molten mixture can be cast in a plate that is about 0.125 inches thick. This can provide a composite metal surface with a suitable amount of strength. In alternative embodiments, the amounts of binder and metal powder can be changed and the thickness of the composite metal surface can be changed.

In another embodiment, a silicone mold can be made of a part. A mixture of 90% by weight Ancorlam 1000 C and 10% by weight Grade: A-C 820 polyethylene. The molten mixture can be poured into the mold to form a composite metal surface.

The above description is that of current embodiments of the invention. Various alterations and changes can be made without departing from the spirit and broader aspects of the invention. Any reference to elements in the singular, for example, using the articles "a," "an," "the" or "said," is not to be construed as limiting the element to the singular.

The invention claimed is:

1. An electrical device comprising:
a housing;
a coil located within the housing of the electrical device;
wherein the housing includes an electromagnetic shield surface;
wherein the housing includes a composite metal surface including an effective amount of metal powder and an effective amount of hinder to at least one of permit effective transmission of wireless power from the coil through the composite metal surface and permit effective reception of wireless power by the coil through the composite metal surface, wherein the effective transmission of wireless power or the effective reception of wireless power is subject to 5% or less of an electromagnetic field lost in the composite metal surface; and
wherein the composite metal surface acts as an electromagnetic aperture in the electromagnetic shield surface.

2. The electrical device of claim 1 wherein the bulk conductivity of the composite metal surface is in the order of $10^{-6}$ Mohs.

3. The electrical device of claim 1 wherein the metal powder is non-ferromagnetic.

4. The electrical device of claim 1 wherein the composite metal surface is a multi-layer composite metal surface and one layer includes an increased amount of metal powder to make the composite metal surface look metallic and a different layer includes an increased amount of binder to increase the structural integrity of the composite metal surface.

5. The electrical device of claim 1 wherein the effective amount of metal powder includes a blend of a first metal powder and a second metal powder, wherein the first metal powder is subject to a first amount of electromagnetic losses at a frequency and wherein the second metal powder is subject to a second amount of electromagnetic losses at the frequency, wherein a ratio of first metal powder and second metal powder in the blend is selected to be subject to electromagnetic losses between the first amount of electromagnetic losses at the frequency and the second amount of electromagnetic losses at the frequency.

6. The electrical device of claim 1 wherein the composite metal surface is a plate having a thickness of at least 0.3mm.

7. The electrical device of claim 1 wherein the effective amount of metal powder is more than 95% by weight.

8. The electrical device of claim 1 wherein the electrical device is at least one of a telephone, remote control, keyboard, mouse, game controller, camera, laptop, and inductive power supply.

9. The electrical device of claim 1 wherein the housing includes a joint between the electromagnetic shield surface and the composite metal surface.

10. The electrical device of claim 9 wherein the housing includes a lip for increasing the strength of the joint between the shield surface and the composite metal surface.

11. A portable electrical device comprising:
a housing;
a coil located within the housing of the portable electrical device;
wherein the housing includes an electromagnetic shield;
wherein the housing includes a composite metal surface including an effective amount of metal powder and an effective amount of binder to permit effective reception of wireless power by the coil through the composite metal surface, wherein the effective reception of wireless power is subject to 5% or less of an electromagnetic field lost in the composite metal surface; and
wherein the composite metal surface acts as an electromagnetic aperture in the electromagnetic shield.

12. The portable electrical device of claim 11 wherein the housing includes a joint between the electromagnetic shield and the composite metal surface.

13. The portable electrical device of claim 12 wherein the housing includes a lip for increasing the strength of the joint between the metal housing and the composite metal surface.

14. The portable electrical device of claim 11 wherein the composite metal surface is a multi-layer composite metal surface.

15. The portable electrical device of claim 11 wherein the effective amount of metal powder includes a blend of a first metal powder and a second metal powder, wherein the first metal powder is subject to a first amount of electromagnetic losses at a frequency and wherein the second metal powder is subject to a second amount of electromagnetic losses at the frequency, wherein a ratio of first metal powder and second metal powder in the blend is selected to be subject to electromagnetic losses between the first amount of electromagnetic losses at the frequency and the second amount of electromagnetic losses at the frequency.

16. The portable electrical device of claim 11 wherein the portable electrical device is at least one of a telephone, remote control, keyboard, mouse, game controller, camera, and laptop.

17. An inductive power supply comprising:
a housing;
a coil located within the housing of the inductive power supply;
wherein the housing includes an electromagnetic shield;
wherein the housing includes a composite metal surface including an effective amount of metal powder and an effective amount of binder to permit effective transmission of wireless power by the coil through the composite metal surface, wherein the effective transmission of wireless power is subject to 5% or less of an electromagnetic field lost in the composite metal surface; and
wherein the composite metal surface acts as an electromagnetic aperture in the electromagnetic shield.

18. The inductive power supply of claim 17 wherein the composite metal surface is a multi-layer composite metal surface.

19. The inductive power supply of claim 17 wherein the effective amount of metal powder includes a blend of a first metal powder and a second metal powder, wherein the first metal powder is subject to a first amount of electromagnetic losses at a frequency and wherein the second metal powder is subject to a second amount of electromagnetic losses at the frequency, wherein a ratio of first metal powder and second metal powder in the blend is selected to be subject to electromagnetic losses between the first amount of electromagnetic losses at the frequency and the second amount of electromagnetic losses at the frequency.

20. The inductive power supply of claim 17 including an array of primary coils to transmit wireless power through the composite metal surface of the housing to a secondary coil located in a remote device.

21. The portable electrical device of claim 17 wherein the housing includes a joint between the electromagnetic shield and the composite metal surface.

22. The inductive power supply of claim 21 wherein the housing includes a lip for increasing e strength of the joint between the electromagnetic shield and the composite metal surface.

* * * * *